(12) United States Patent
Wloczysiak et al.

(10) Patent No.: US 10,784,903 B2
(45) Date of Patent: *Sep. 22, 2020

(54) PHASE CONTROL FOR CARRIER AGGREGATION

(71) Applicant: SKYWORKS SOLUTIONS, INC., Woburn, MA (US)

(72) Inventors: Stephane Richard Marie Wloczysiak, Irvine, CA (US); William J. Domino, Yorba Linda, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/286,440

(22) Filed: Feb. 26, 2019

(65) Prior Publication Data

US 2019/0268027 A1 Aug. 29, 2019

Related U.S. Application Data

(63) Continuation of application No. 14/683,512, filed on Apr. 10, 2015, now Pat. No. 10,218,390.

(Continued)

(51) Int. Cl.
*H04B 1/00* (2006.01)
*H04L 5/08* (2006.01)
(Continued)

(52) U.S. Cl.
CPC .......... *H04B 1/0057* (2013.01); *H03F 1/565* (2013.01); *H04L 5/001* (2013.01); *H04L 5/0023* (2013.01);
(Continued)

(58) Field of Classification Search
None
See application file for complete search history.

(56) References Cited

U.S. PATENT DOCUMENTS

| 7,010,273 B2 | 3/2006 | Satoh et al. |
| 10,218,390 B2 * | 2/2019 | Wloczysiak .......... H04L 5/0023 |

(Continued)

FOREIGN PATENT DOCUMENTS

| CN | 102439789 A | 5/2012 |
| CN | 103684481 A | 3/2014 |

(Continued)

*Primary Examiner* — James P Duffy
(74) *Attorney, Agent, or Firm* — Chang & Hale LLP

(57) ABSTRACT

Phase control for carrier aggregation. In some embodiments, a carrier aggregation circuit can include a first filter configured to allow operation in a first frequency band, and a second filter configured to allow operation in a second frequency band. The circuit can further include a first path implemented between the first filter and a common node, with the first path being configured to provide a substantially matched impedance for the first frequency band and a substantially open-circuit impedance for the second frequency band. The circuit can further include a second path implemented between the second filter and the common node, with the second path being configured to provide a substantially matched impedance for the second frequency band and a substantially open-circuit impedance for the first frequency band.

20 Claims, 15 Drawing Sheets

Related U.S. Application Data

(60) Provisional application No. 61/978,808, filed on Apr. 11, 2014.

(51) Int. Cl.
  *H04W 76/28* (2018.01)
  *H03F 1/56* (2006.01)
  *H04L 5/00* (2006.01)

(52) U.S. Cl.
  CPC ............... *H04L 5/08* (2013.01); *H04W 76/28* (2018.02); *H03F 2200/111* (2013.01); *H03F 2200/222* (2013.01); *H03F 2200/294* (2013.01)

(56) References Cited

U.S. PATENT DOCUMENTS

| | | |
|---|---|---|
| 2008/0211586 A1 | 9/2008 | Galan |
| 2009/0015508 A1 | 1/2009 | Prikhodko et al. |
| 2010/0157858 A1 | 6/2010 | Lee et al. |
| 2011/0210805 A1 | 9/2011 | Link et al. |
| 2013/0122831 A1 | 5/2013 | Desclos et al. |
| 2014/0003300 A1 | 1/2014 | Weissman et al. |
| 2014/0073268 A1 | 3/2014 | Taniuchi et al. |
| 2014/0092795 A1 | 4/2014 | Granger-Jones |
| 2014/0112213 A1 | 4/2014 | Norholm et al. |
| 2016/0020737 A1* | 1/2016 | Kong ..................... H03F 3/19 455/73 |

FOREIGN PATENT DOCUMENTS

| | | |
|---|---|---|
| EP | 0744831 A2 | 11/1996 |
| EP | 0959567 A1 | 11/1999 |
| GB | 2512586 A | 10/2014 |
| JP | 2002-118487 A | 4/2002 |
| JP | 2003-087150 A | 3/2003 |
| JP | 2012-514387 A | 6/2012 |
| WO | 2005107064 A1 | 11/2005 |
| WO | 2010075190 A | 7/2010 |
| WO | 2013027580 A | 2/2013 |
| WO | 2013041146 A | 3/2013 |
| WO | 2013155305 A | 10/2013 |

* cited by examiner

PHASE CONTROL FOR CARRIER AGGREGATION

CROSS-REFERENCE TO RELATED APPLICATION(S)

This application is a continuation of U.S. application Ser. No. 14/683,512 filed Apr. 10, 2015, entitled CIRCUITS AND METHODS RELATED TO RADIO-FREQUENCY RECEIVERS HAVING CARRIER AGGREGATION, which claims priority to and the benefit of the filing date of U.S. Provisional Application No. 61/978,808 filed Apr. 11, 2014, entitled CIRCUITS AND METHODS RELATED TO RADIO-FREQUENCY RECEIVERS HAVING CARRIER AGGREGATION, the benefits of the filing dates of which are hereby claimed and the disclosures of which are hereby expressly incorporated by reference herein in their entirety.

BACKGROUND

Field

The present disclosure relates to carrier aggregation in radio-frequency applications.

Description of the Related Art

In some radio-frequency (RF) applications, cellular carrier aggregation (CA) can involve two or more RF signals being processed through a common path. For example, carrier aggregation can involve use of a path for a plurality of bands having frequency ranges that are sufficiently separated. In such a configuration, simultaneous operation of more than one band can be achieved.

SUMMARY

In accordance with a number of implementations, the present disclosure relates to a carrier aggregation (CA) circuit that includes a first filter configured to allow operation in a first frequency band, and a second filter configured to allow operation in a second frequency band. The CA circuit further includes a first path implemented between the first filter and a common node, with the first path being configured to provide a substantially matched impedance for the first frequency band and a substantially open-circuit impedance for the second frequency band. The CA circuit further includes a second path implemented between the second filter and the common node, with the second path being configured to provide a substantially matched impedance for the second frequency band and a substantially open-circuit impedance for the first frequency band.

In some embodiments, the first filter and the second filter can be parts of a diplexer. The diplexer can include an input port configured to receive a radio-frequency (RF) signal from an antenna. The common node can be configured to be coupled to an input of a low-noise amplifier (LNA). The LNA can be configured to amplify frequency bands of the received RF signal corresponding to the first frequency band and the second frequency band. The first frequency band can include, for example, a B3 band having a frequency range of 1.805 to 1.880 GHz, and the second frequency band can include, for example, a B1 band having a frequency range of 2.110 to 2.170 GHz. The second frequency band can further include a B4 band having a frequency range of 2.110 to 2.155 GHz.

In some embodiments, the first frequency band can include a B2 band having a frequency range of 1.930 to 1.990 GHz, and the second frequency band can include a B2 band having a frequency range of 2.110 to 2.155 GHz. The first frequency band can further include a B25 band having a frequency range of 1.930 to 1.995 GHz. In some embodiments, the first frequency band can include a B2 band having a frequency range of 1.930 to 1.990 GHz, and the second frequency band can include a B4 band having a frequency range of 2.110 to 2.155 GHz.

In some embodiments, the first path can include a first phase shifting circuit, and the second path can include a second phase shifting circuit. In some embodiments, the first phase shifting circuit can include, for example, two series capacitances and an inductive shunt path that couples a node between the two capacitances and a ground. The second phase shifting circuit can include two series capacitances and an inductive shunt path that couples a node between the two capacitances and a ground. In some embodiments, at least some of the capacitances and inductances of the first and second phase shifting circuits can be implemented as lumped elements. In some embodiments, at least some of the capacitances and inductances of the first and second phase shifting circuits can be implemented as distributed elements.

In some embodiments, the first phase shifting circuit can include two series inductances and a capacitive shunt path that couples a node between the two inductances and a ground. The second phase shifting circuit can include two series inductances and a capacitive shunt path that couples a node between the two inductances and a ground. In some embodiments, at least some of the capacitances and inductances of the first and second phase shifting circuits can be implemented as lumped elements. In some embodiments, at least some of the capacitances and inductances of the first and second phase shifting circuits can be implemented as distributed elements.

In some embodiments, each of the first path and the second path can include a switch to allow the CA circuit to operate in a CA mode or a non-CA mode. The switch for the first path can be at an output of the first phase shifting circuit and the switch for the second path can be at an output of the second phase shifting circuit. Both switches for the first and second paths can be closed for the CA mode. One of the two switches can be closed and the other switch can be closed for the non-CA mode.

In some implementations, the present disclosure relates to a radio-frequency (RF) module having a packaging substrate configured to receive a plurality of components, and a carrier aggregation (CA) circuit implemented on the packaging substrate. The CA circuit includes a first filter configured to allow operation in a first frequency band, and a second filter configured to allow operation in a second frequency band. The CA circuit further includes a first path implemented between the first filter and a common node, with the first path being configured to provide a substantially matched impedance for the first frequency band and a substantially open-circuit impedance for the second frequency band. The CA circuit further includes a second path implemented between the second filter and the common node, with the second path being configured to provide a substantially matched impedance for the second frequency band and a substantially open-circuit impedance for the first frequency band.

In some embodiments, each of the first filter and the second filter can include a surface acoustic wave (SAW) filter. The first SAW filter and the second SAW filter can be implemented as a diplexer. In some embodiments, the RF module can further include a low-noise amplifier (LNA) implemented on the packaging substrate. The LNA can be coupled to the common node to receive a combined signal from the first path and the second path. In some embodiments, the RF module can be a front-end module. In some embodiments, the RF module can be a diversity receive (DRx) module.

In some embodiments, the first path can include a first phase shifting circuit, and the second path can include a second phase shifting circuit. Each of the first phase shifting circuit and the second phase shifting circuit can include capacitance and inductance elements. At least some of the capacitance and inductance elements can be implemented as passive devices mounted on or within the packaging substrate.

In a number of teachings, the present disclosure relates to a method for fabricating a radio-frequency (RF) module. The method includes providing or forming a packaging substrate configured to receive a plurality of components, and implementing a carrier aggregation (CA) circuit on the packaging substrate. The CA circuit includes a first filter configured to allow operation in a first frequency band, and a second filter configured to allow operation in a second frequency band. The CA circuit further includes a first path implemented between the first filter and a common node, with the first path being configured to provide a substantially matched impedance for the first frequency band and a substantially open-circuit impedance for the second frequency band. The CA circuit further includes a second path implemented between the second filter and the common node, with the second path being configured to provide a substantially matched impedance for the second frequency band and a substantially open-circuit impedance for the first frequency band.

According to some implementations, the present disclosure relates to a radio-frequency (RF) device having a receiver configured to process RF signals, and an RF module in communication with the receiver. The RF module includes a carrier aggregation (CA) circuit. The CA circuit includes a first filter configured to allow operation in a first frequency band, and a second filter configured to allow operation in a second frequency band. The CA circuit further includes a first path implemented between the first filter and a common node, with the first path being configured to provide a substantially matched impedance for the first frequency band and a substantially open-circuit impedance for the second frequency band. The CA circuit further includes a second path implemented between the second filter and the common node, with the second path being configured to provide a substantially matched impedance for the second frequency band and a substantially open-circuit impedance for the first frequency band. The RF device further includes an antenna in communication with the RF module, with the antenna being configured to receive the RF signals.

In some embodiments, the RF device can be a wireless device. In some embodiments, the wireless device can be a cellular phone. In some embodiments, the antenna can include a diversity antenna, and the RF module can include a diversity receive (DRx) module). The wireless device can further include an antenna switch module (ASM) configured to route the RF signals from the diversity antenna to the receiver. In some embodiments, the DRx module can be implemented between the diversity antenna and the ASM.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Cellular carrier aggregation (CA) can be supported by allowing two or more radio-frequency (RF) signals to be processed through a common path. For example, carrier aggregation can involve use of a path for a plurality of bands having frequency ranges that are sufficiently separated. In such a configuration, simultaneous operation of more than one band is possible.

In the context of a receiver, carrier aggregation can allow concurrent processing of RF signals in a plurality of bands to provide, for example, high data rate capability. In such a carrier aggregation system, it is desirable to maintain a low noise figure (NF) for each RF signal. When two bands being aggregated are close in frequency, maintaining sufficient separation of the two bands is also desirable.

Figure 1:
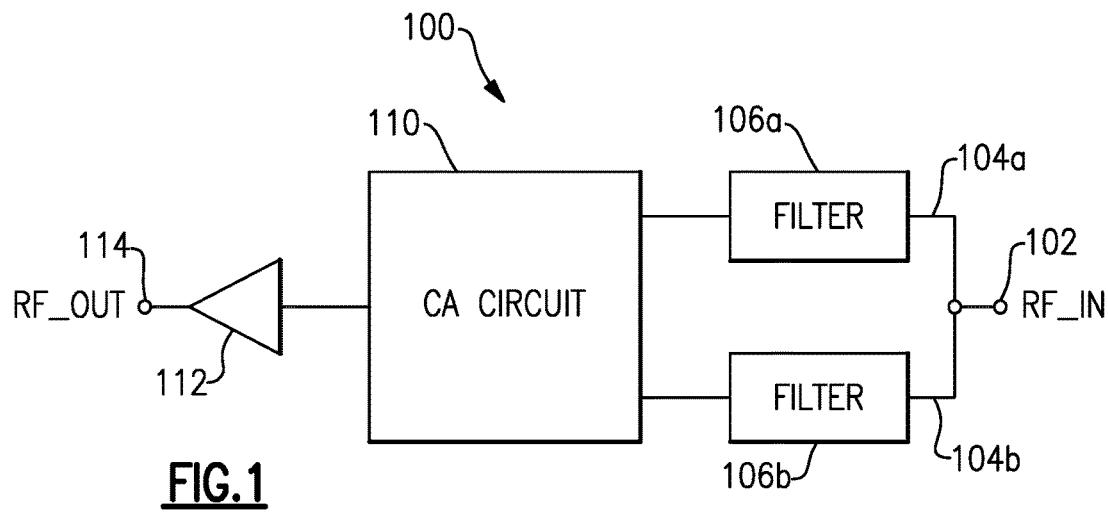
FIG. 1 shows a carrier aggregation (CA) configuration that includes a CA circuit configured to receive a plurality of inputs and yield an output.

FIG. 1 shows a carrier aggregation (CA) configuration 100 that includes a CA circuit 110 configured to receive a plurality of inputs and yield an output. The plurality of inputs can include a first RF signal and a second RF signal. The first RF signal can be provided to the CA circuit 110 from a common input node 102 (RF_IN), through a first path 104a that includes a first filter 106a. Similarly, the second RF signal can be provided to the CA circuit 110 from the common input node 102 (RF_IN), through a second path 104b that includes a second filter 106b. As described herein, the CA circuit 110 can be configured such that the output at a common output node 114 is a recombined RF signal that includes two separated frequency bands associated with the first and second RF signals. As also described herein, the CA circuit 110 can be configured to yield desirable performance features such as low loss, low noise figure, and/or high isolation between the two signal paths 104a, 104b.

Various examples herein, including the example of FIG. 1, are described in the context of aggregating two frequency bands. However, it will be understood that one or more features of the present disclosure can be implemented in aggregation of more than two frequency bands. For example, FIG. 2 shows a CA aggregation configuration 100 where three RF signals are separated at a common input node 102 (RF_IN), processed through their respective filters 106a, 106b, 106c, and recombined by a CA circuit 110 to yield a recombined RF signal at a common output node 114 (RF_OUT).

Figure 2:
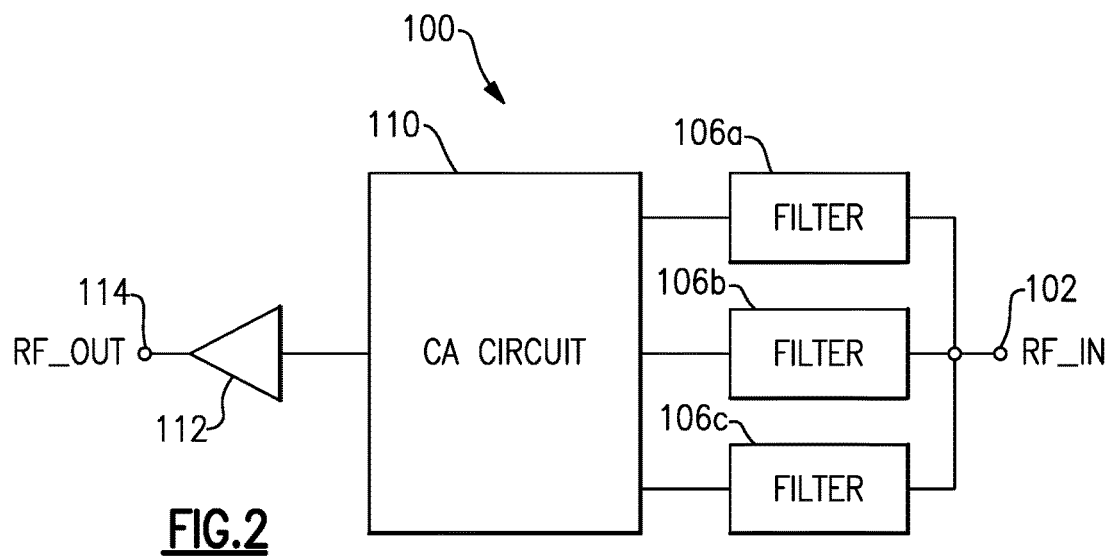
FIG. 2 shows a CA aggregation configuration can involve more than two radio-frequency (RF) signals.
Figure 3:
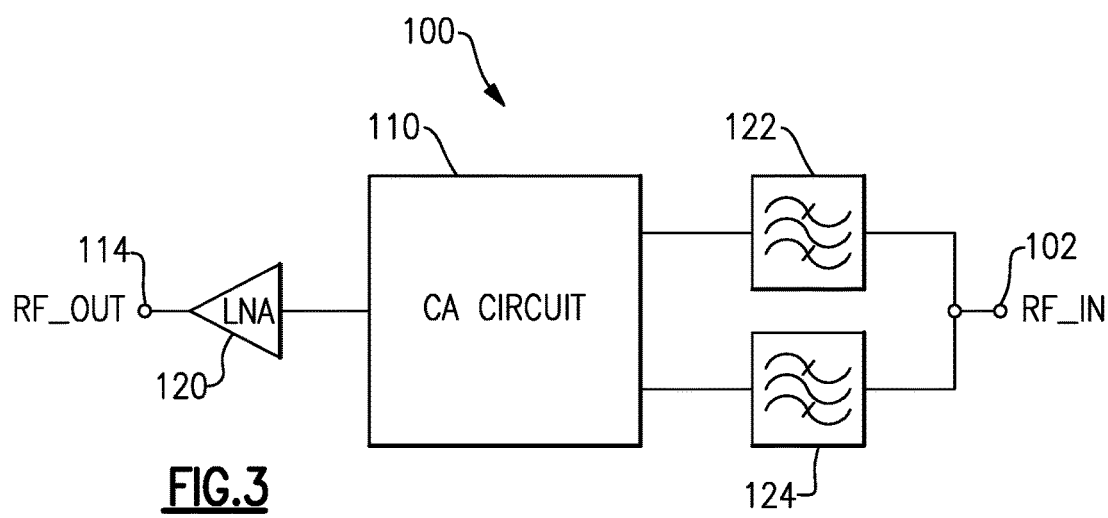
FIG. 3 shows a more specific example where a CA circuit having one or more features as described herein can be implemented with a low-noise amplifier (LNA) in a receiver.

The aggregation configurations 100 of FIGS. 1 and 2 can be implemented in a number of RF applications. FIG. 3 shows a more specific example where a CA circuit 110 having one or more features as described herein can be implemented with a low-noise amplifier (LNA) in a receiver. The CA circuit 110 can be configured to receive a plurality of inputs and yield an output. The plurality of inputs can include a first RF signal and a second RF signal. The first RF signal can be provided to the CA circuit 110 from a common input node 102 (RF_IN), through a first path that includes a first band-pass filter 122. Similarly, the second RF signal can be provided to the CA circuit 110 from the common input node 102 (RF_IN), through a second path that includes a second band-pass filter 124. As described herein, the CA circuit 110 can be configured such that the output at a common output node 114 is a recombined RF signal that includes two separated frequency bands associated with the first and second RF signals. As also described herein, the CA circuit 110 can be configured to yield desirable performance features such as low loss, low noise figure, and/or high isolation between the two input signal paths.

In FIG. 3, the recombined RF signal is shown to be provided to an LNA 130 to amplify and thereby generate a low-noise amplified output signal at an output node 114. The LNA 130 can be configured to operate with a sufficiently wide bandwidth to effectively amplify the first and second bands of the recombined RF signal.

In some embodiments, the pass-band filters 122, 124 can be implemented in a number of ways, including, for example, as surface acoustic wave (SAW) filters. It will be understood that other types of filters can be utilized.

Figure 4:
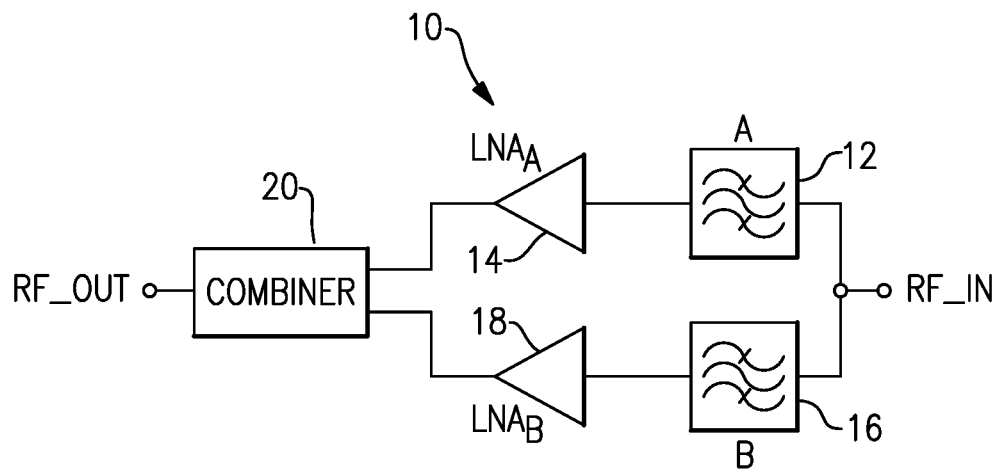
FIG. 4 shows an aggregation configuration where an RF signal is separated at a common input node (RF_IN), and each of the two separated RF signals is processed by a band-pass filter and amplified by an LNA.

As described herein, the aggregation configuration 100 of FIG. 3 can provide a number of advantageous features over other aggregation configurations. For example, FIG. 4 shows an aggregation configuration 10 where an RF signal is separated at a common input node (RF_IN); and each of the two separated RF signals is processed by a band-pass filter (12 or 16) and amplified by an LNA (14 or 18). The separately processed and amplified RF signals (bands "A" and "B") are shown to be combined by a combiner 20 to yield an output RF signal at a common output node (RF_OUT).

In the example of FIG. 4, the combined output RF signal includes amplified noise contribution from each of the two LNAs. Accordingly, noise figure can degrade by, for example, approximately 3 dB.

Figure 5:
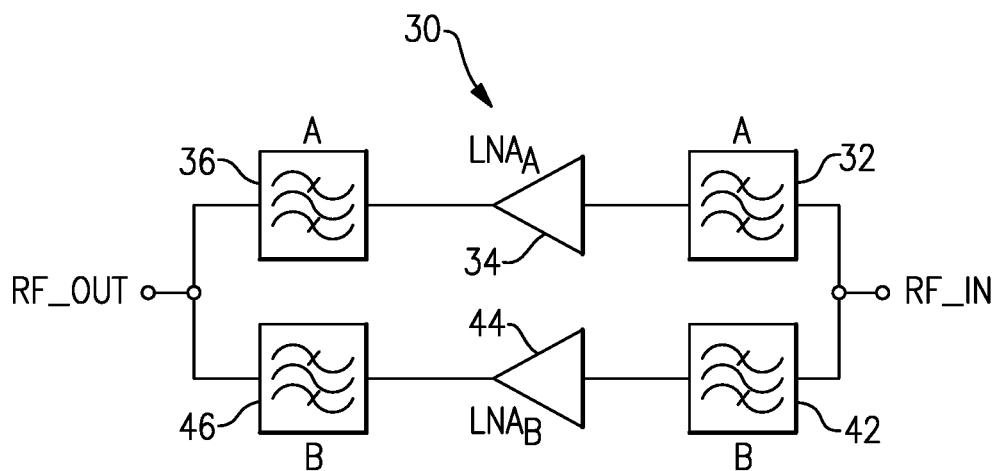
FIG. 5 shows an example of an aggregation configuration where additional filtering of LNA outputs can be implemented to better isolate the frequency band distributions between different bands.

Typically, lack of proper isolation between RF paths (e.g., paths associated with bands "A" and "B" of FIG. 4) and their respective bands contributes to the noise figure of the combined RF signal. FIG. 5 shows an example of an aggregation configuration 30 where additional filtering of LNA outputs can be implemented to better isolate the frequency band distributions between "A" and "B" bands. Similar to the example of FIG. 4, the example aggregation configuration 30 includes an RF signal being separated at a common input node (RF_IN); and each of the two separated RF signals being processed by a band-pass filter (32 or 42) and amplified by an LNA (34 or 44). The separately processed and amplified RF signals (bands "A" and "B") are shown to be further filtered by respective filters 36, 46 before being combined to yield a combined RF signal at a common output node (RF_OUT). As a result of this filtering, the total noise output at the common output node (RF_OUT) in band "A" typically includes only a contribution from the LNA 34, while total noise output at the common output node (RF_OUT) in band "B" typically includes only a contribution from the LNA 44. While this arrangement avoids the aforementioned example 3 dB noise degradation, it typically suffers from the excess cost associated with the two LNAs and the two post-LNA filters.

In general, filters constructed from higher Q resonators provide better isolation of frequency bands, especially for bands that are relatively close to each other. For example, cellular frequency bands B1 and B3 have ranges of 2.110 to 2.170 GHz and 1.805 to 1.880 GHz, respectively, for receive operations. For such a pair of relatively close frequency bands, good band isolation is typically not possible with low Q resonators. Accordingly, high Q resonators are typically required or desired. However, use of such additional high Q resonators downstream of the two LNAs (e.g., 34, 44 in FIG. 5) can be undesirable due to, for example, additional cost and required space.

Figure 6:
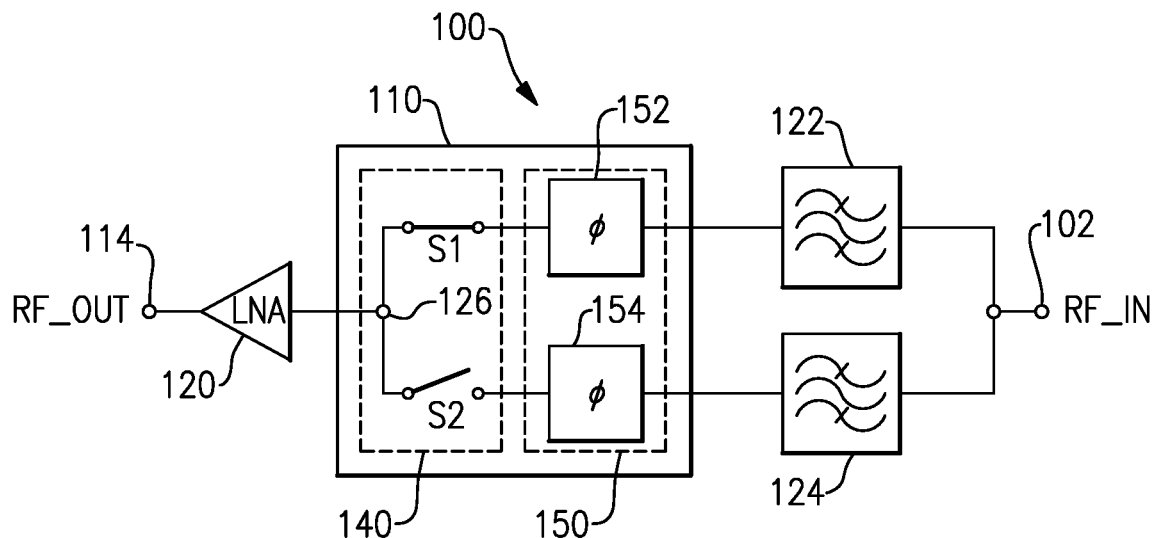
FIG. 6 shows a CA configuration that can be a more specific example of the configuration of FIG. 3.

FIG. 6 shows a CA configuration 100 that can be a more specific example of the configuration of FIG. 3. The CA configuration 100 of FIG. 6 can provide a number of desirable features, including those that address some or all of the problems associated with the examples of FIGS. 4 and 5.

In FIG. 6, the example CA configuration 100 includes an RF signal being separated at a common input node 102 (RF_IN). The first separated RF signal is shown to be filtered by a band-pass filter 122, and the second separated RF signal is shown to be filtered by a band-pass filter 124. The first and second filtered RF signals are shown to be provided to a CA circuit 110 which is configured to yield a combined signal at a common node 126.

The CA circuit 110 is shown to include a phase circuit generally indicated as 150, and a switch circuit generally indicated as 140. Examples of functionalities that can be provided by the phase circuit 150 and the switch circuit 140 are described herein in greater detail.

The first filtered RF signal from the band-pass filter 122 is shown to be passed through a first phase shifting circuit 152. Similarly, the second filtered RF signal from the band-pass filter 124 is shown to be passed through a second phase shifting circuit 154. Examples of such phase shifting circuits are described herein in greater detail.

The first and second RF signals from their respective phase shifting circuits (152, 154) are shown to be combined at the common node 126. In some embodiments, a switch S1 can be implemented between the first phase shifting circuit 152 and the common node 126, and a switch S2 can be implemented between the second phase shifting circuit 154 and the common node 126. Such switches can allow the CA circuit 110 to operate in a non-CA mode or a CA mode. For example, in FIG. 6, the first switch S1 is shown to be closed, and the second switch S2 is shown to be open, such that the CA circuit 110 processes the first RF signal in the corresponding frequency band in a non-CA mode. To process the second RF signal in the other frequency band in a non-CA mode, the first switch S1 can be opened, and the second switch S2 can be closed. In another example, as shown in FIG. 7, both of the first and second switches can be closed, such that the CA circuit 110 processes both of the first and second RF signals in their respective frequency bands in a CA mode.

Figure 7:
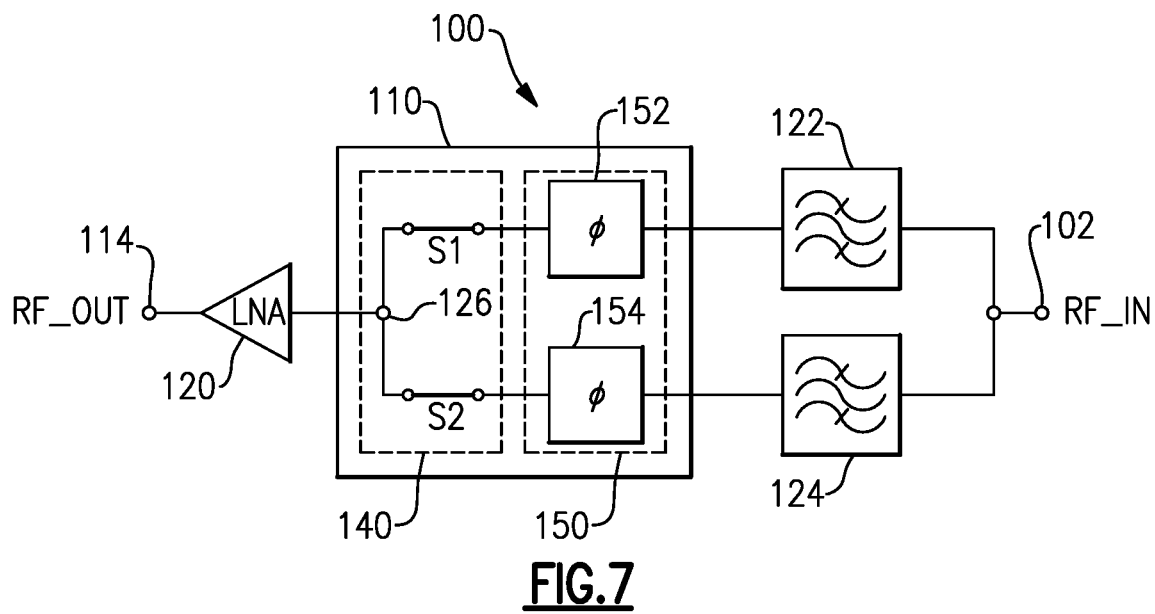
FIG. 7 shows the CA configuration of FIG. 6 being operated in a CA mode.

In FIGS. 6 and 7, the common node 126 is shown to be coupled to an input of an LNA 120 to allow the processed RF signal (either a combined RF signal in a CA mode or a single-band RF signal in a non-CA mode) to be processed by the LNA 120. The LNA 120 is shown to generate an amplified RF signal as an output (RF_OUT) at node 114.

In the example of FIGS. 6 and 7, the switch circuit 140 can allow the CA circuit 110 to operate in either the non-CA mode or CA mode. In embodiments where the CA circuit 110 is configured to operate in CA mode only, the switch circuit 140 may be omitted.

Figure 8:
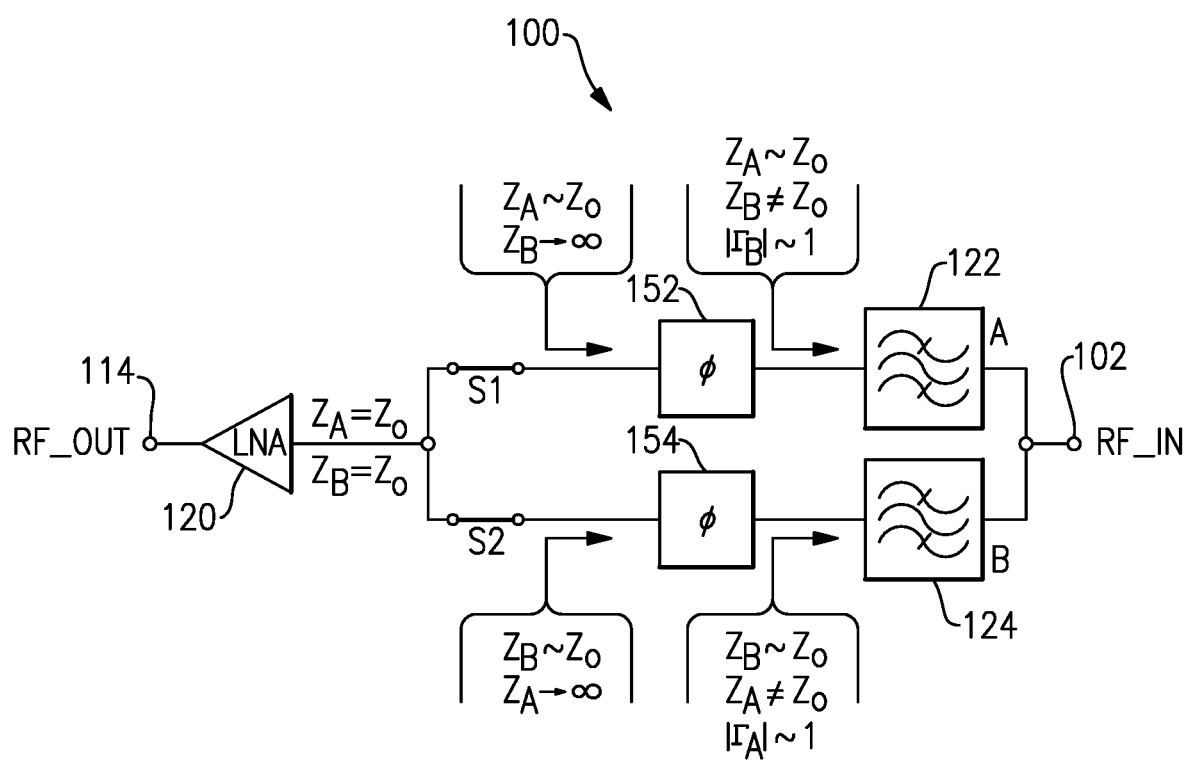
FIG. 8 shows an example CA configuration where the first and second signal paths of FIG. 7 can be configured to provide selected impedances to facilitate the CA operation.

FIG. 8 shows an example CA configuration 100 where the first and second signal paths can be configured to provide selected impedances to facilitate the CA operation. For the purpose of description, such signal paths can be referred to as "A" and "B" bands, and such bands can include any combination of bands suitable for carrier aggregation. As in the example of FIG. 7, both of the switches S1, S2 can be in their closed states to facilitate the CA operation.

As shown in the example of FIG. 8, the first and second phase shifting circuits 152, 154 can be utilized to couple the first (A) and second (B) band-pass filters 122, 124 with the LNA 120, and to provide desired impedance values for signals being combined and routed to the LNA 120. Examples of such adjustments of impedance values by the first and second phase shifting circuits 152, 154 are described herein in greater detail.

Impedance of the first filter 122 can be tuned to provide a desired impedance for an A-band signal. Accordingly, impedance $Z_A$ for the A-band signal at the output of the A-band filter 122 is approximately at a matched value of $Z_o$ (e.g., 50 Ohms). In the B band, the impedance $Z_B$ for the B-band signal at the output of the A-band filter 122 is not matched to $Z_o$. Since the B band resides in the stopband of the A-band filter, the reflection coefficient $|\Gamma_B|$ of this mismatch is approximately unity. However, the phase of this reflection is typically dependent upon the filter design. Accordingly, the impedance $Z_B$ for the B-band signal at the output of the A-band filter 122 could be any widely mismatched value, either much greater or much smaller than $Z_o$, that results in the condition $|\Gamma_B| \sim 1$.

Ideally, the A-band filter 122 should present an open circuit for a B-band signal. However, the A-band filter 122 may not provide such an ideal open-circuit impedance for the B-band signal. Accordingly, impedance $Z_B$ for the B-band signal at the output of the A-band filter 122 can be expressed in a complex form $Z_B = R_B + jX_B$, where the real part (resistance $R_B$) and the imaginary part (reactance $X_B$) place the impedance $Z_B$ significantly away from the open circuit state (where one or both of $X_B$ and $R_B$ is/are approximately at infinity). As shown in FIG. 8, the first phase shifting circuit 152 can be configured so as to substantially maintain $Z_o$ for $Z_A$, and adjust $Z_B$ from $R_B\ jX_B$ to, or close to, the open circuit state.

Similarly, impedance of the second filter 124 can be tuned to provide a desired impedance for the B-band signal. Accordingly, impedance $Z_B$ for the B-band signal at the output of the B-band filter 124 is approximately at the matched value of $Z_o$ (e.g., 50 Ohms). In the A band, the impedance $Z_A$ for the A-band signal at the output of the B-band filter 122 is not matched to $Z_o$. Since the A band resides in the stopband of the B-band filter, the reflection coefficient $|\Gamma_A|$ of this mismatch is approximately unity. However, the phase of this reflection is dependent upon the filter design. Accordingly, the impedance $Z_A$ for the A-band signal at the output of the B-band filter 122 could be any widely mismatched value, either much greater or much smaller than $Z_o$, that results in the condition $|\Gamma_A| \sim 1$.

Ideally, the B-band filter 124 should look like an open circuit for the A-band signal. However, the B-band filter 124 may not provide such an ideal open-circuit impedance for the A-band signal. Accordingly, impedance $Z_A$ for the A-band signal at the output of the B-band filter 124 can be expressed in a complex form $Z_A = R_A + jX_A$, where the real part (resistance $R_A$) and the imaginary part (reactance $X_A$) place the impedance $Z_A$ significantly away from the open circuit state (where one or both of $X_A$ and $R_A$ is/are approximately at infinity). As shown in FIG. 8, the second phase shifting circuit 154 can be configured so as to substantially maintain $Z_o$ for $Z_B$, and adjust $Z_A$ from $R_A + jX_A$ to, or close to, the open circuit state.

As shown in FIG. 8, the CA configuration 100 with the first and second signal paths configured in the foregoing manner allows the combination of the A-band signal and the B-band signal from their respective paths to be impedance matched for the LNA, and to have the non-band frequency components substantially blocked out. Accordingly, noise figure performance can be improved without having to utilize additional high-Q filters such as SAW filters.

Figure 9:
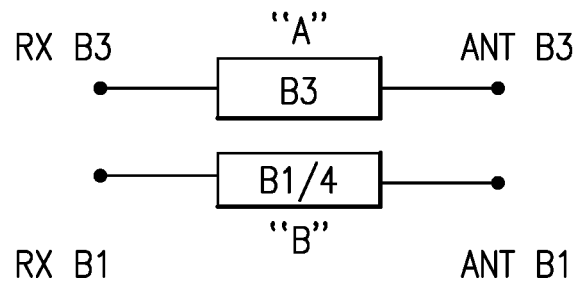
FIG. 9 shows two isolated receive (Rx) paths associated with example bands B3 and B1/4.

FIGS. 9-15 show examples of two frequency band paths and how phase shifting circuits along such paths can yield desirable impedances as described in reference to FIG. 8. In FIG. 9, two isolated receive (Rx) paths associated with example bands B3 (1,805-1,880 MHz) and B1/4 (2,110-2,170 MHz) are shown. The B3 band path can be considered to be an example of the generic A-band path of FIG. 8, and the B1/4 band path can be considered to be an example of the generic B-band path.

In FIG. 9, the isolated B3 band path includes a B3 filter "A" between an antenna node (ANT B3) and an output node (RX B3). However, the B3 band path does not include a phase shifting circuit between the B3 filter and the output node (RX B3). Similarly, the isolated B1/4 band path includes a B1/4 filter "B" between an antenna node (ANT B1) and an output node (RX B1), but not a phase shifting circuit.

Figure 10:
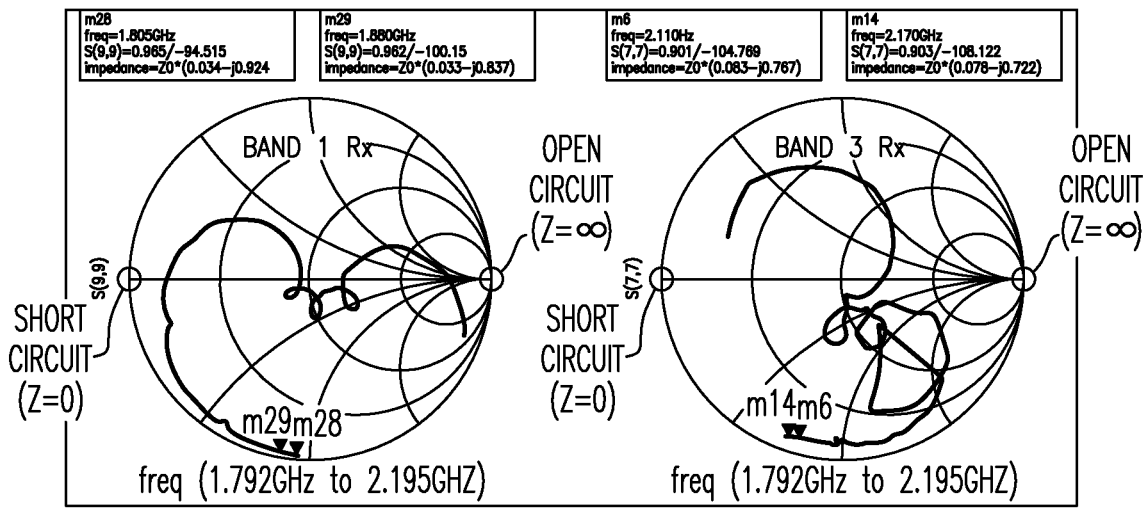
FIG. 10 shows example Smith plots of complex impedance values for the circuit of FIG. 9.
Figure 10:
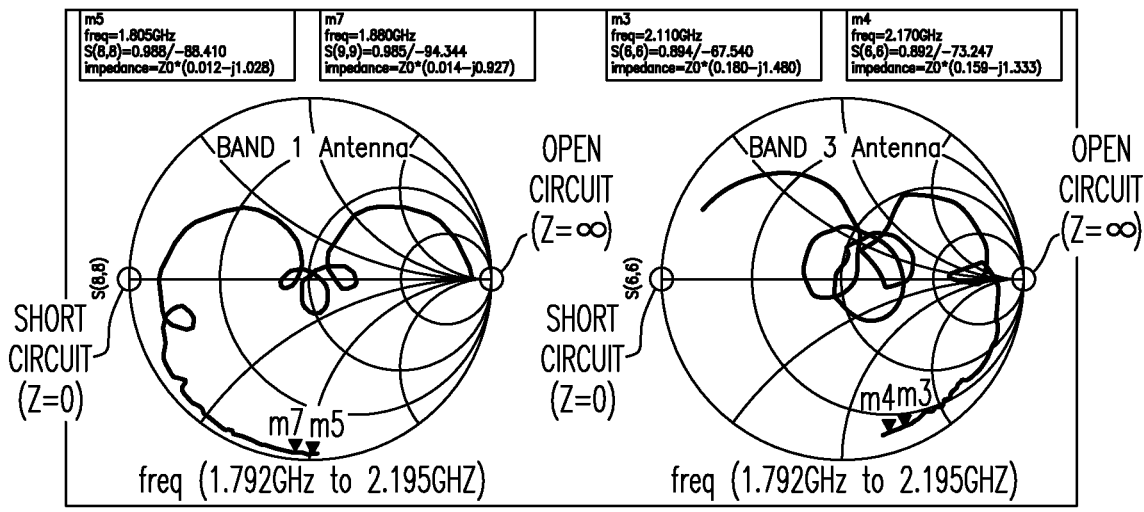

FIG. 10 shows example Smith plots of complex impedance values at the RX B1 node (upper left plot), BX B3 node (upper right plot), ANT B1 node (lower left plot), and ANT B3 node (lower right plot) in a frequency sweep between 1.792 GHz and 2.195 GHz, for the circuit of FIG. 9. More particularly, impedance values for points m28 and m29 correspond to lower (1.805 GHz) and upper (1.880 GHz) limits, respectively, of the B3 Rx band at the RX B1 node; impedance values for points m6 and m14 correspond to lower (2.110 GHz) and upper (2.170 GHz) limits, respectively, of the B1 Rx band at the RX B3 node; impedance values for points m5 and m7 correspond to lower (1.805 GHz) and upper (1.880 GHz) limits, respectively, of the B3 Rx band at the ANT B1 node; and impedance values for points m3 and m4 correspond to lower (2.110 GHz) and upper (2.170 GHz) limits, respectively, of the B1 Rx band at the ANT B3 node.

In FIG. 10, one can see that each of the impedance ranges (m28 to m29, m6 to m14, m5 to m7, m3 to m4) is significantly displaced from the open-circuit impedance location on the Smith plot, while remaining close to the outer perimeter of the Smith plot.

Figure 11:
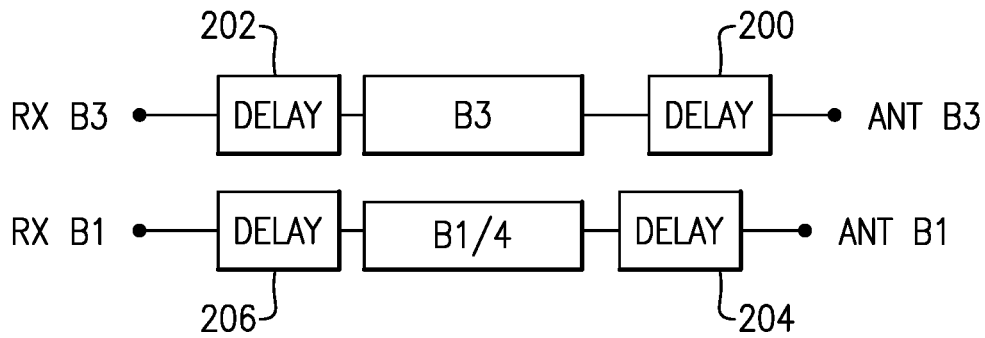
FIG. 11 shows two isolated receive (Rx) paths associated with the example bands B3 and B1/4, where each path includes a first phase shifting circuit, a filter, and a second phase shifting circuit between its antenna node and an output node.

FIG. 11 shows two isolated receive (Rx) paths associated with the example bands B3 Rx (1,805-1,880 MHz) and B1/4 Rx (2,110-2,170 MHz), where each path includes a first phase shifting circuit, a filter, and a second phase shifting circuit between its antenna node and an output node. More particularly, the B3 path includes a first phase shifting circuit 200, a B3 filter, and a second phase shifting circuit 202 between an antenna node (ANT B3) and an output node (RX B3). Similarly, the B1/4 band path includes a first phase shifting circuit 204, a B1/4 filter, and a second phase shifting circuit 206 between an antenna node (ANT B1) and an output node (RX B1).

Figure 12:
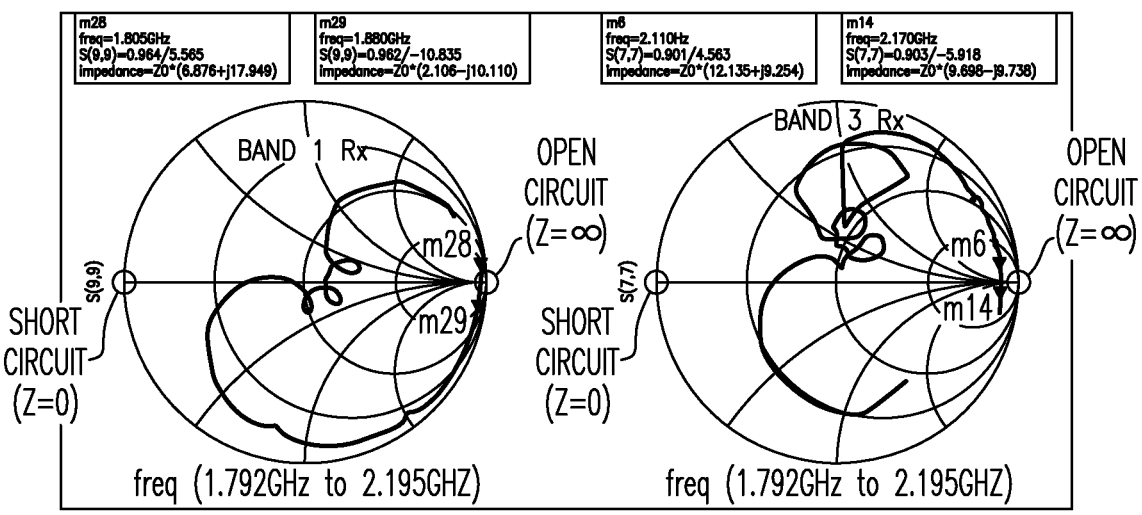
FIG. 12 shows example Smith plots of complex impedance values for the circuit of FIG. 11.
Figure 12:
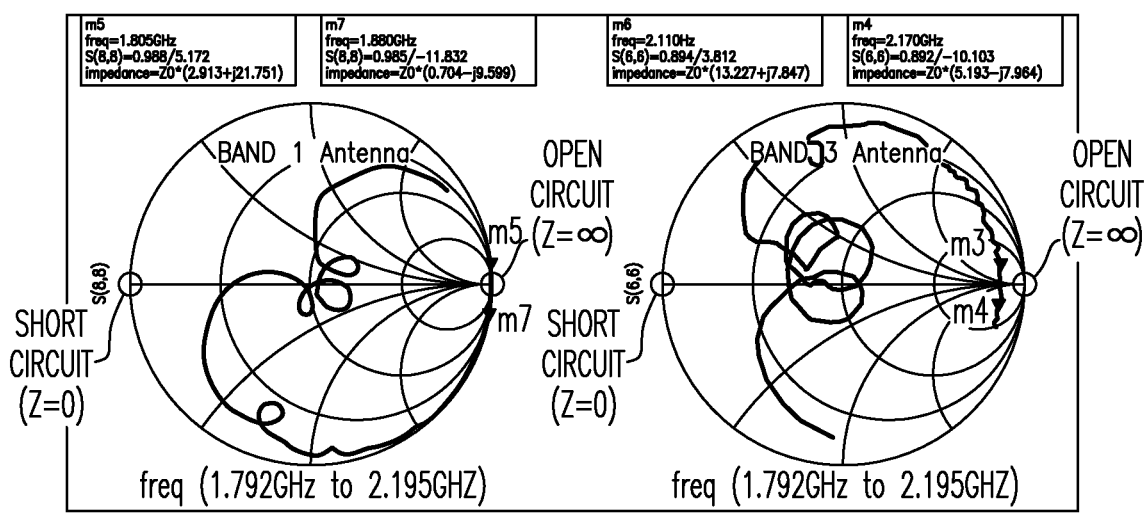

FIG. 12 shows example Smith plots of complex impedance values at the RX B1 node (upper left plot), BX B3 node (upper right plot), ANT B1 node (lower left plot), and ANT B3 node (lower right plot), for the circuit of FIG. 11. Similar to the example of FIG. 10, impedance values for points m28 and m29 correspond to lower (1.805 GHz) and upper (1.880 GHz) limits, respectively, of the B3 Rx band at the RX B1 node; impedance values for points m6 and m14 correspond to lower (2.110 GHz) and upper (2.170 GHz) limits, respectively, of the B1 Rx band at the RX B3 node; impedance values for points m5 and m7 correspond to lower (1.805 GHz) and upper (1.880 GHz) limits, respectively, of the B3 Rx band at the ANT B1 node; and impedance values for points m3 and m4 correspond to lower (2.110 GHz) and upper (2.170 GHz) limits, respectively, of the B1 Rx band at the ANT B3 node.

In FIG. 12, one can see that each of the four plots has been rotated, by an amount such that each of the impedance ranges (m28 to m29, m6 to m14, m5 to m7, m3 to m4) straddles the Im(Z)=0 line, and has a large Re(Z) value so as to be at or close to the open-circuit impedance location on the Smith plot. In some embodiments, the amount of delay applied by each delay element in FIG. 11 can be selected to yield the amount of rotation shown in the corresponding Smith plot.

As described in reference to FIGS. 11 and 12, it is desirable to have antenna side of the filters to be tuned to present high impedance to opposite-band signals. In some embodiments, the antenna side of a diplexer (e.g., a B3-B1/4 diplexer) can be configured to present a desired high impedance for an opposite-band (e.g., a B3 band frequency signal or a B1/4 band frequency signal) entering a band filter (e.g., a B1/4 band filter or a B3 band filter) of the diplexer.

Figure 13:
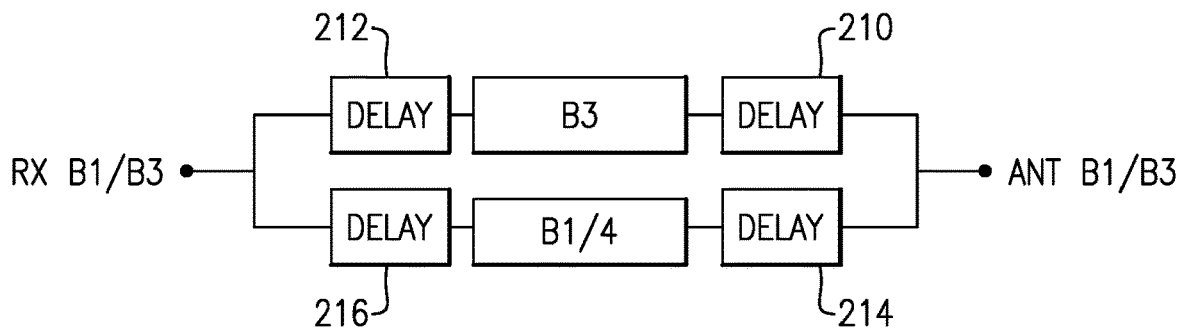
FIG. 13 shows the two example receive (Rx) paths of FIG. 11 connected at the ends so as to yield a common antenna node and a common output node.

FIG. 13 shows the two example receive (Rx) paths of FIG. 11 connected at the ends so as to yield a common antenna node (ANT B1/B3) and a common output node (RX B1/B3). In some embodiments, such coupled paths can be configured such that each band path provides a substantially open-circuit impedance for an out-band signal (e.g., B1/4 band signal in the B3 band path, and B3 band signal in the B1/4 band path) as described in FIGS. 11 and 12, as well as to provide, when coupled together as shown in FIG. 13, matched impedances for the two band signals, at both the common antenna node (ANT B1/B3) and the common output node (RX B1/B3).

Figure 14:
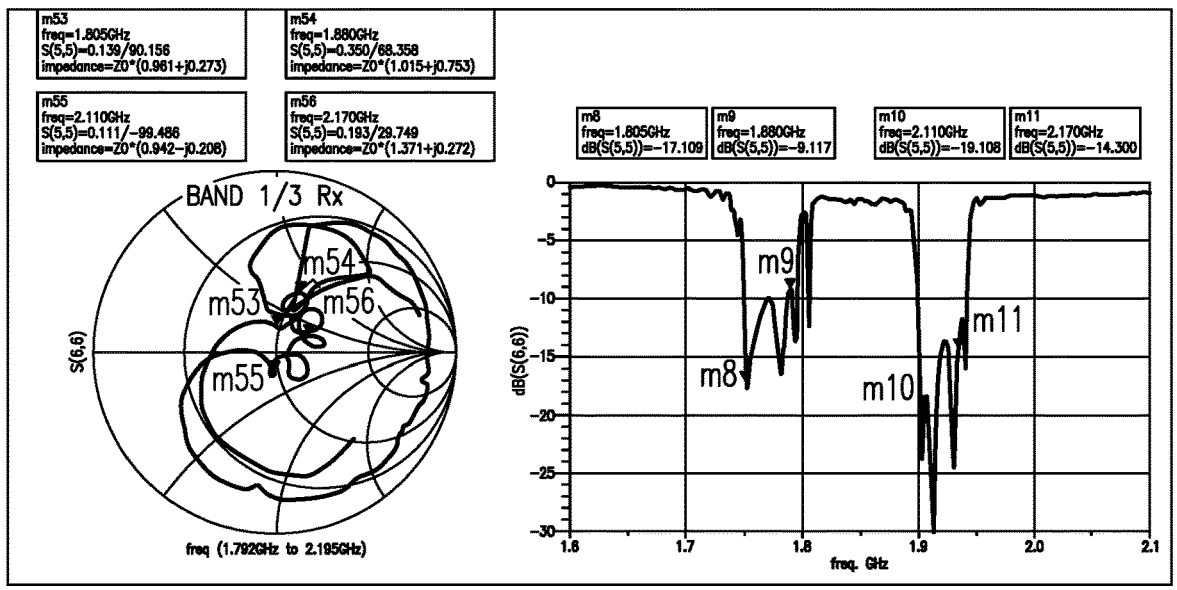
FIG. 14 shows example Smith plots of complex impedance values for the circuit of FIG. 13.
Figure 14:
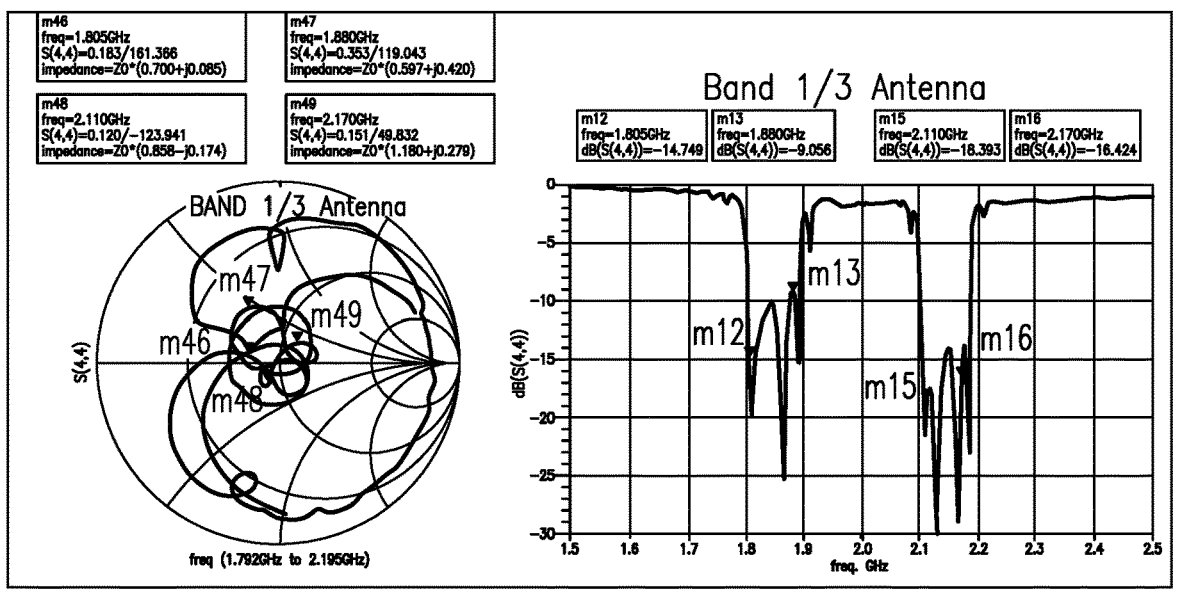

FIG. 14 shows example Smith plots of complex impedance values at the common output node RX B1/B3 (upper left plot), and at the common antenna node (ANT B1/B3) (lower left plot), for the circuit of FIG. 13. For the RX B1/B3 node, impedance values for points m53 and m54 correspond to B3 band frequencies of 1.805 GHz and 1.880 GHz, respectively, and impedance values for points m55 and m56 correspond to B1 band frequencies of 2.110 GHz and 2.170 GHz, respectively. All points m54, m54, m55, m56 are clustered near the center of the Smith chart, indicating that the impedance of the RX B1/B3 node is substantially well-matched to 50 ohms at all frequencies in both bands B1 and B3. This occurs because each path in its own band is generally undisturbed by the other path; thus the combined circuit presents a match in band B1 determined substantially by the B1 path alone, and a match in band B3 determined substantially by the B3 path alone, even though the paths are physically tied together.

Likewise, for the ANT B1/B3 node, impedance values for points m46 and m47 correspond to frequencies of 1.805 GHz and 1.880 GHz, respectively, and impedance values for points m48 and m49 correspond to B1 band frequencies of 2.110 GHz and 2.170 GHz, respectively. All points m46, m47, m48, m49 are clustered near the center of the Smith chart, indicating that the impedance of the ANT B1/B3 node is substantially well-matched to 50 ohms at all frequencies in both bands B1 and B3. This occurs because each path in its own band is generally undisturbed by the other path; thus the combined circuit presents a match in band B1 determined substantially by the B1 path alone, and a match in band B3 determined substantially by the B3 path alone, even though the paths are physically tied together.

FIG. 14 further shows a distribution of reflection coefficient S11 (S(4,4) in FIG. 14) at the ANT B1/B3 node (lower right panel) and a distribution of reflection coefficient S22 (S(5,5) in FIG. 14) at the RX B1/B3 node (upper right panel), for the circuit of FIG. 13. In the S11 (S(4,4)) and S22

Figure 15:
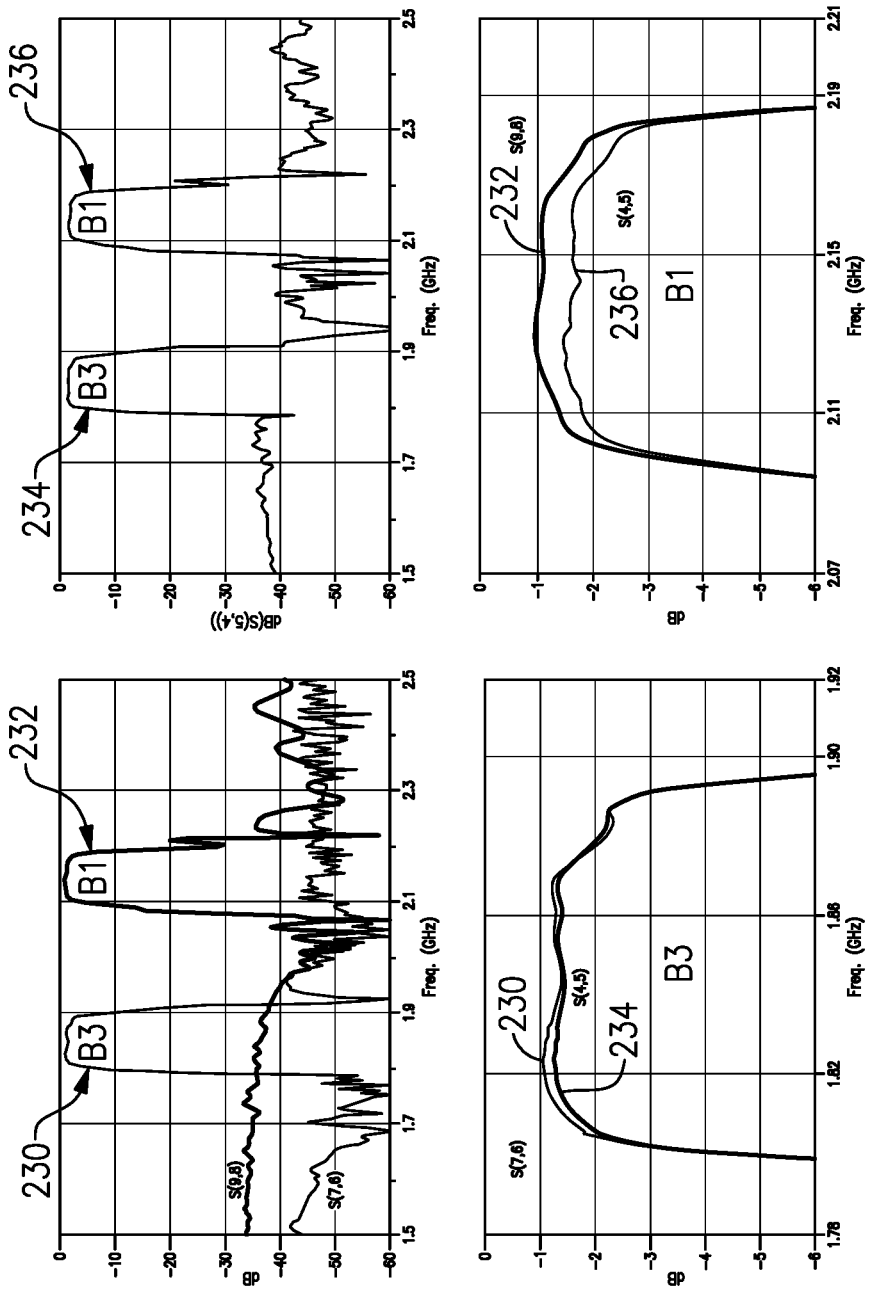
FIG. 15 shows various spectrum response curves associated with the examples of FIGS. 9, 11 and 13.

(S(5,5)) distributions, the matching at each of the two RX bands (B3 RX and B1 RX) is prominent FIG. 15 shows, in the upper left panel, a spectrum response of the B3 receive path, and an independent spectrum response of the B1 receive path, for the circuit of FIG. 9. The same responses apply, substantially unchanged, to the circuit of FIG. 11, since the added delays in FIG. 11 generally affect only phase and not amplitude for each path. A peak in gain of the B3 RX band (e.g., a B3 passband) is indicated as 230, and a peak in gain of the B1 RX band (e.g., a B1 passband) is indicated as 232. It is noted that each path exhibits greater than 30 dB attenuation in the opposite band.

In FIG. 15, the upper right panel shows a single spectrum response for the circuit of FIG. 13. It is noted that this single response exhibits two passbands, with the B3 RX passband indicated as 234, and the B1 RX passband indicated as 236.

In FIG. 15, the lower left panel shows an overlap of the B3 RX passband 230 exhibited by the independent B3 receive path of FIG. 9/FIG. 11, with the B3 RX passband 234 exhibited by the combined circuit of FIG. 13. The lower right panel shows an overlap of the B1 RX passband 232 exhibited by the independent B1 receive path of FIG. 9/FIG. 11, with the B1 RX passband 236 exhibited by the combined circuit of FIG. 13. In both examples of the lower right panel and the lower left panel, one can see that each passband of the combined circuit of FIG. 13 substantially resembles the passband of the respective independent receive path from which it was formed, in both bandwidth and characteristic ripple. Further, the gain distribution of a given band before the corresponding phase shifting circuit is added and the paths combined, is only slightly higher than the distribution after such addition of the phase shifting circuit and combining of the paths. Thus, one can see that the phase shifting circuits having one or more features as described herein can be configured to provide desired functionalities with little or no loss.

Figure 16A:
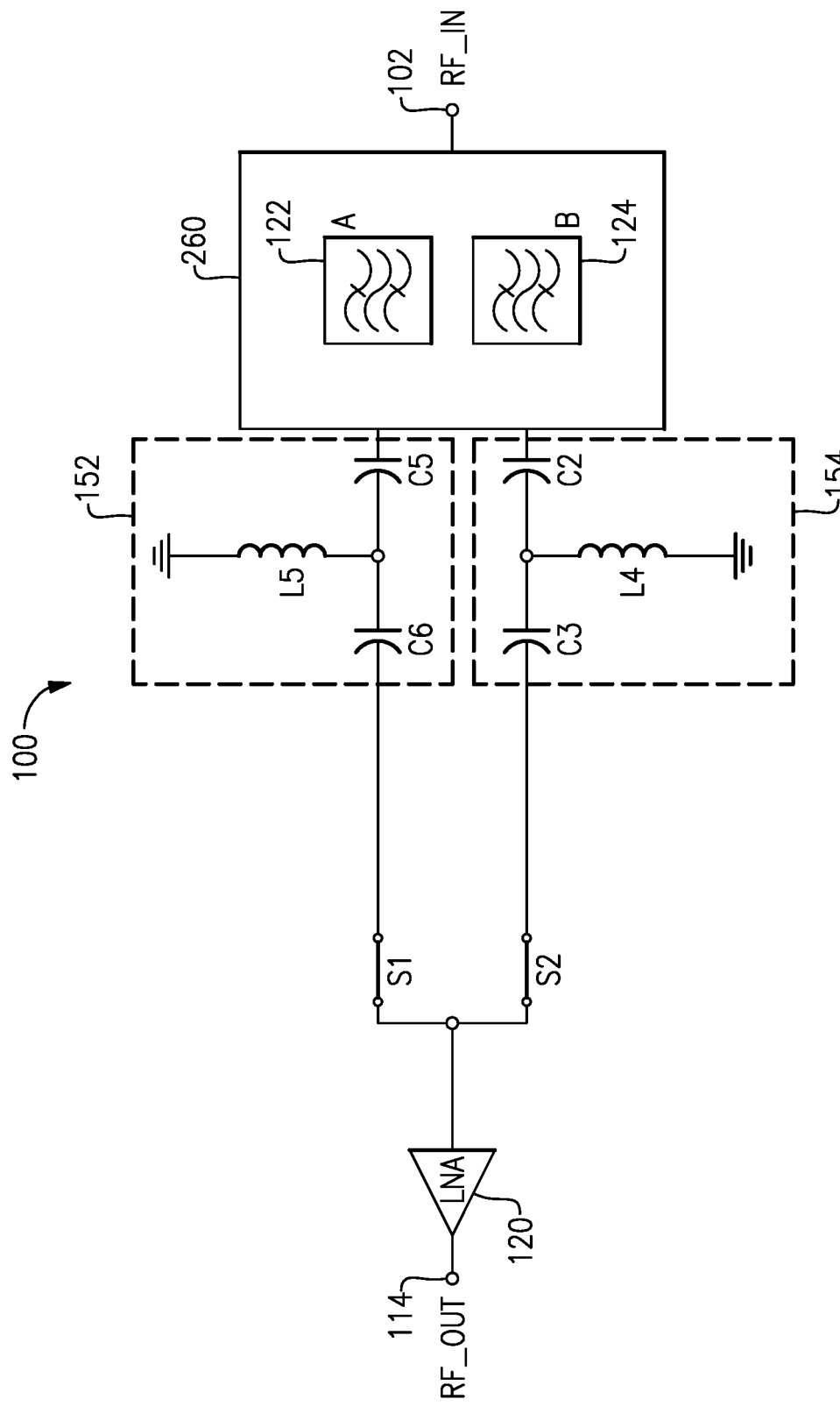
FIG. 16A shows examples of the phase shifting circuits of FIGS. 13-15.

FIG. 16A shows more specific examples of the phase shifting circuits such as circuits 212, 216 of FIGS. 13-15. In FIG. 16A, a CA configuration 100 can be an example of the CA configuration 100 of FIG. 8. An input RF signal (RF_IN) from an antenna can be received at an input node 102. A diplexer 260 is shown to be coupled to the input node 102 so as to receive the input RF signal. Such a received signal can be processed through filters 122, 124 configured to provide band-pass functionality for band A and band B. Examples of such bands are described herein in greater detail. In some embodiments, the diplexer 260 can be configured to provide impedance matching for the input RF signal, as described herein in reference to FIGS. 11-15.

Outputs of the band-pass filters 122, 124 are shown to be routed to a first path that includes a first phase shifting circuit 152, and a second path that includes a second phase shifting circuit 154. The first path is shown to further include a switch S1 between the first phase shifting circuit 152 and a common output node. The second path is shown to further include a switch S2 between the second phase shifting circuit 154 and the common output node.

The common output node receiving processed signals from the foregoing first and second paths is shown to be coupled to an input of an LNA 120. The LNA 120 is shown to yield an amplified output signal (RF_OUT) at a node 114.

The first phase shifting circuit 152 is shown to include capacitances C5 and C6 arranged in series between its input (from an output of the band A filter 122) and the switch S1. An inductance L5 is shown to couple a node between C5 and C6 with ground.

The second phase shifting circuit 154 is shown to include capacitances C2 and C3 arranged in series between its input (from an output of the band B filter 124) and the switch S2. An inductance L4 is shown to couple a node between C2 and C3 with ground.

Figure 16B:
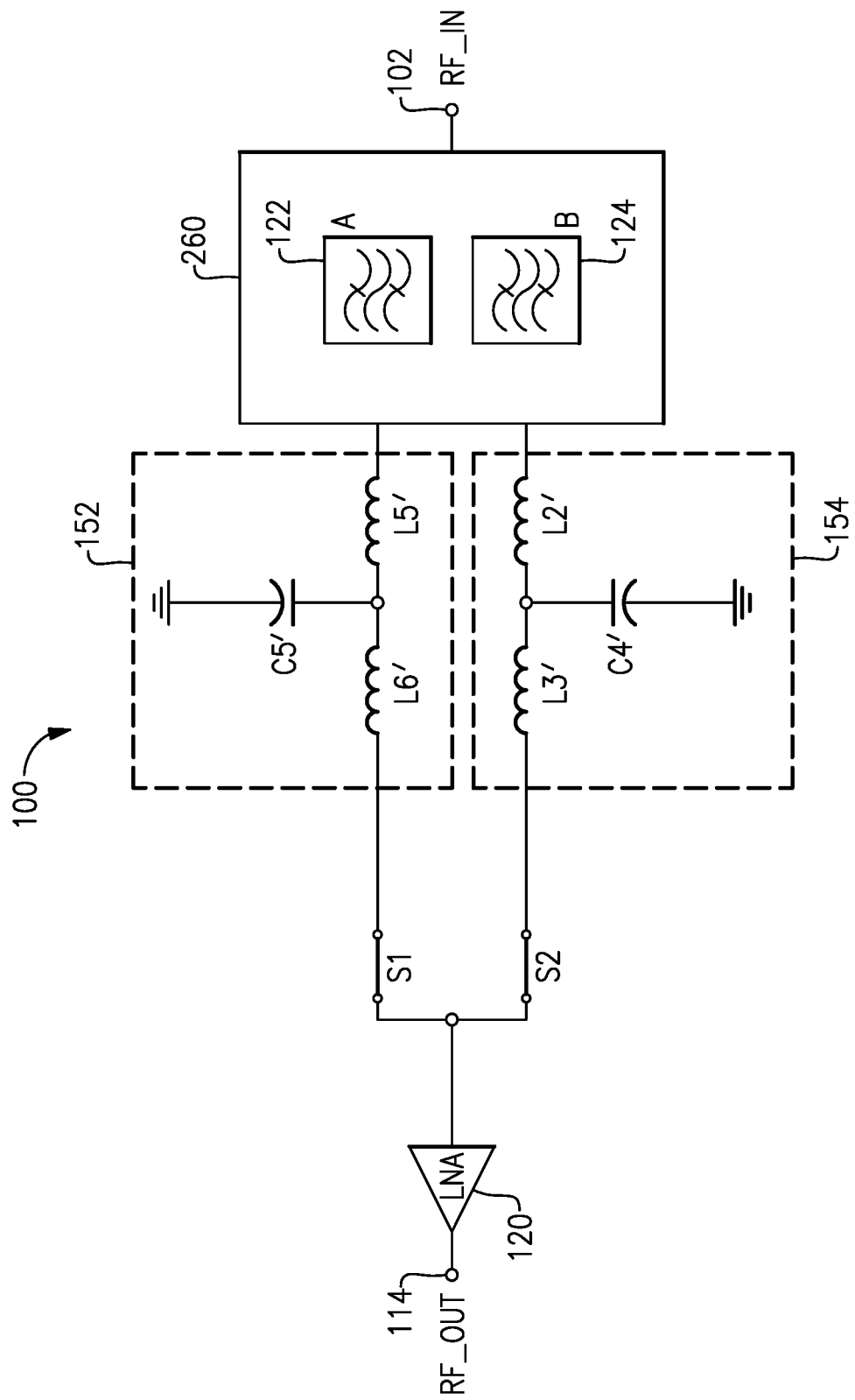
FIG. 16B shows more examples of the phase shifting circuits of FIGS. 13-15.

FIG. 16B shows more specific examples of the phase shifting circuits such as circuits 212, 216 of FIGS. 13-15, implemented in a low-pass phase shifter configuration. In FIG. 16B, a CA configuration 100 can be an example of the CA configuration 100 of FIG. 8. An input RF signal (RF_IN) from an antenna can be received at an input node 102. A diplexer 260 is shown to be coupled to the input node 102 so as to receive the input RF signal. Such a received signal can be processed through filters 122, 124 configured to provide band-pass functionality for band A and band B. Examples of such bands are described herein in greater detail. In some embodiments, the diplexer 260 can be configured to provide impedance matching for the input RF signal, as described herein in reference to FIGS. 11-15.

Outputs of the band-pass filters 122, 124 are shown to be routed to a first path that includes a first phase shifting circuit 152, and a second path that includes a second phase shifting circuit 154. The first path is shown to further include a switch S1 between the first phase shifting circuit 152 and a common output node. The second path is shown to further include a switch S2 between the second phase shifting circuit 154 and the common output node.

The common output node receiving processed signals from the foregoing first and second paths is shown to be coupled to an input of an LNA 120. The LNA 120 is shown to yield an amplified output signal (RF_OUT) at a node 114.

The first phase shifting circuit 152 is shown to include inductances L5' and L6' arranged in series between its input (from an output of the band A filter 122) and the switch S1. A capacitance C5' is shown to couple a node between L5' and L6' with ground.

The second phase shifting circuit 154 is shown to include inductances L2' and L3' arranged in series between its input (from an output of the band B filter 124) and the switch S2. A capacitance C4' is shown to couple a node between L2' and L3' with ground.

In some embodiments, various functionalities as described herein in reference to, for example, FIGS. 8 and 13 can be obtained with values of capacitances and inductances for the example configuration of FIG. 16A for the example bands of B3 RX and B1/4 RX, as listed in Table 1.

TABLE 1

| Capacitance/inductance | Approximate value |
|---|---|
| C2 | 1.71 pF |
| C3 | 1.71 pF |
| C5 | 5.38 pF |
| C6 | 6.38 pF |
| L4 | 4 nH |
| L5 | 7.668 nH |

It will be understood that for other pairs of bands, values for the capacitances and inductances can be selected accordingly. It will also be understood that the same or similar various functionalities may be accomplished with appropriate values for the elements of the example circuit of FIG. 16B.

In some embodiments, some or all of the capacitances and/or inductances can be implemented as parts of signal paths or other conductive features, as lumped elements, or any combination thereof.

Figure 17:
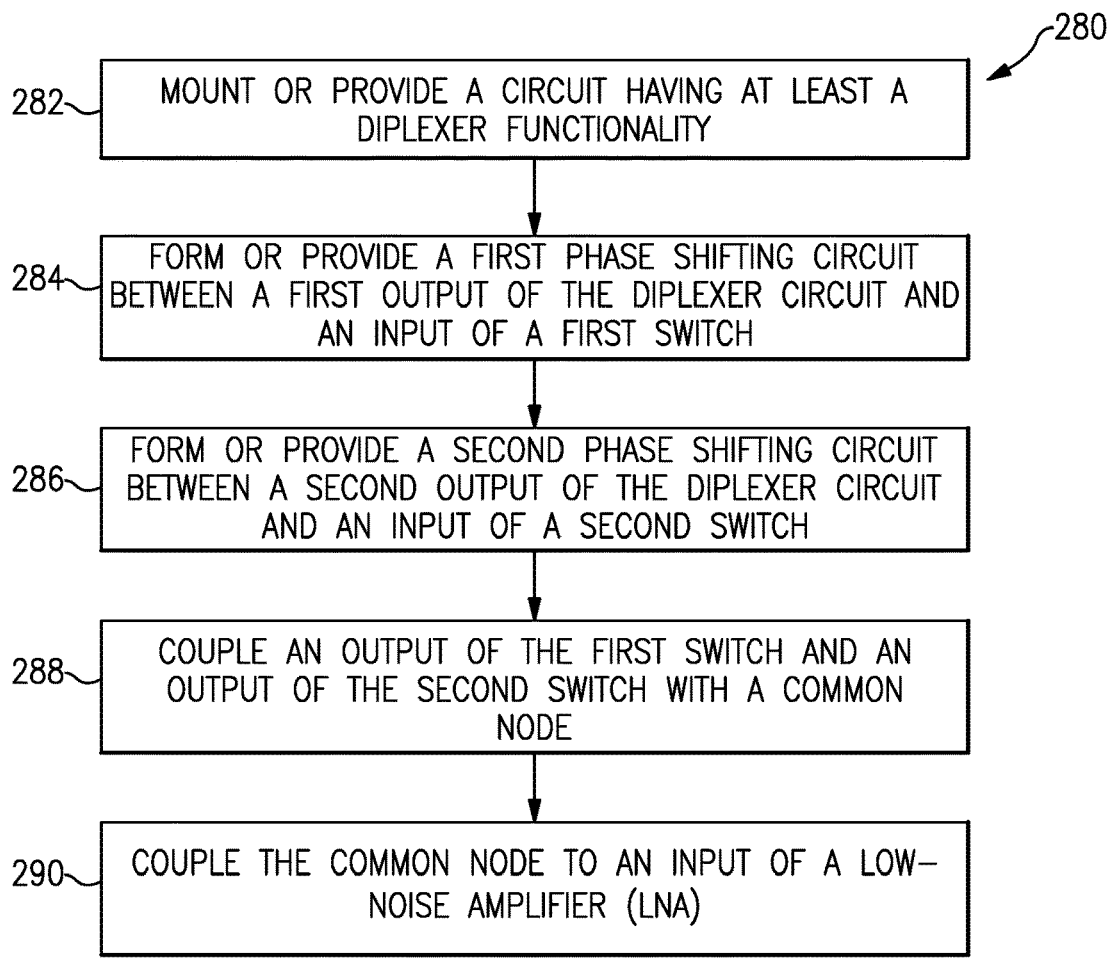
FIG. 17 shows a process that can be implemented to fabricate a device having one or more features as described herein.

FIG. 17 shows a process 280 that can be implemented to fabricate a device having one or more features as described herein. In block 282, a circuit having at least a diplexer functionality can be mounted or provided on a substrate. In various examples, carrier aggregation (CA) is described in the context of diplexers; however, it will be understood that CA can also be implemented with more than two bands (e.g., utilizing multiplexers). In some embodiments, a diplexer can be implemented as a device; and such a device can be mounted on the substrate.

In block 284, a first phase shifting circuit can be formed or provided between a first output of the diplexer circuit and an input of a first switch. In block 286, a second phase shifting circuit can be formed or provided between a second output of the diplexer circuit and an input of a second switch. In block 288, an output of the first switch and an output of the second switch can be coupled with a common node. In some embodiments, such a configuration of the first and second phase shifting circuits being coupled to the common node through their respective switches can facilitate operation of the device in a CA mode or a non-CA mode.

In block 290, the common node can be coupled to an input of a low-noise amplifier (LNA). In some embodiments, such an aggregation of the two signal paths into a single LNA can allow the LNA to operate in the CA mode or the non-CA mode, as determined by the state of the switches.

Figure 18:
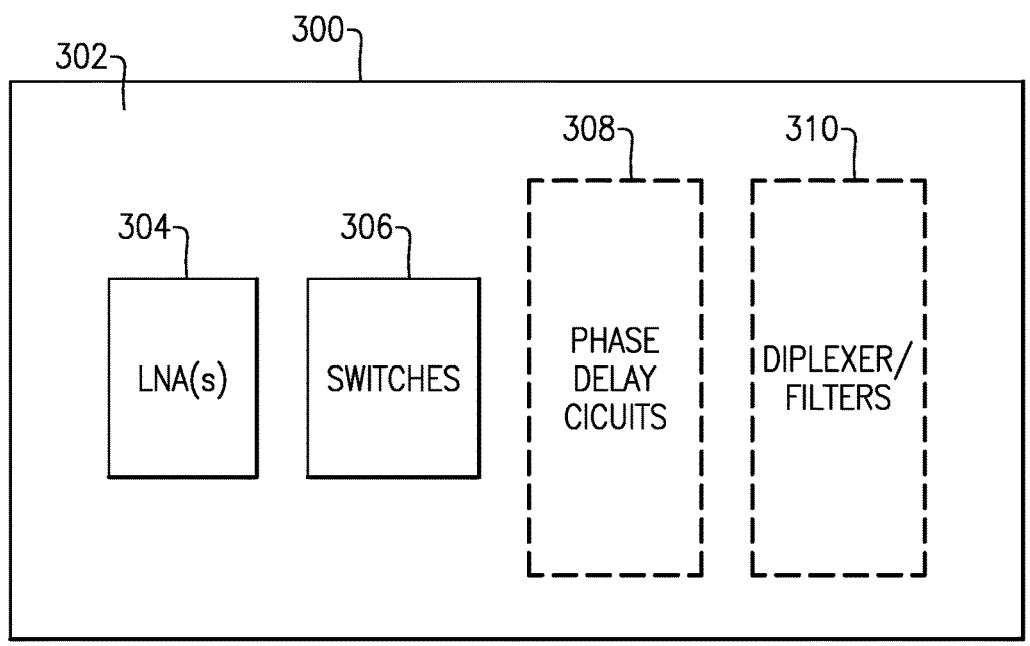
FIG. 18 shows an RF module having one or more features as described herein.

In some embodiments, the device described in FIG. 17 can be a module configured for RF applications. FIG. 18 shows a block diagram of an RF module 300 (e.g., a front-end module) having a packaging substrate 302 such as a laminate substrate. Such a module can include one or more LNAs; and in some embodiments, such LNA(s) can be implemented on a semiconductor die 304. An LNA implemented on such a die can be configured to receive RF signals through signal paths as described herein. Such an LNA can also benefit from the one or more advantageous features associated with improved carrier aggregation (CA) functionalities as described herein.

The module 300 can further include a plurality of switches implemented on one or more semiconductor die 306. Such switches can be configured to provide the various switching functionalities as described herein, including providing and/or facilitating isolation, enabling/disabling CA mode of operation, and band selection in a non-CA mode.

The module 300 can further include one or more diplexers and/or a plurality of filters (collectively indicated as 310) configured to process RF signals. Such diplexers/filters can be implemented as surface-mount devices (SMDs), as part of an integrated circuit (IC), of some combination thereof. Such diplexers/filters can include or be based on, for example, SAW filters, and can be configured as high Q devices.

In FIG. 18, a plurality of phase shifting circuits are collectively indicated as 308. Such phase shifting circuits can include one or more features as described herein to provide, among others, improved isolation between paths associated with different bands being operated in a CA mode.

Figure 19:
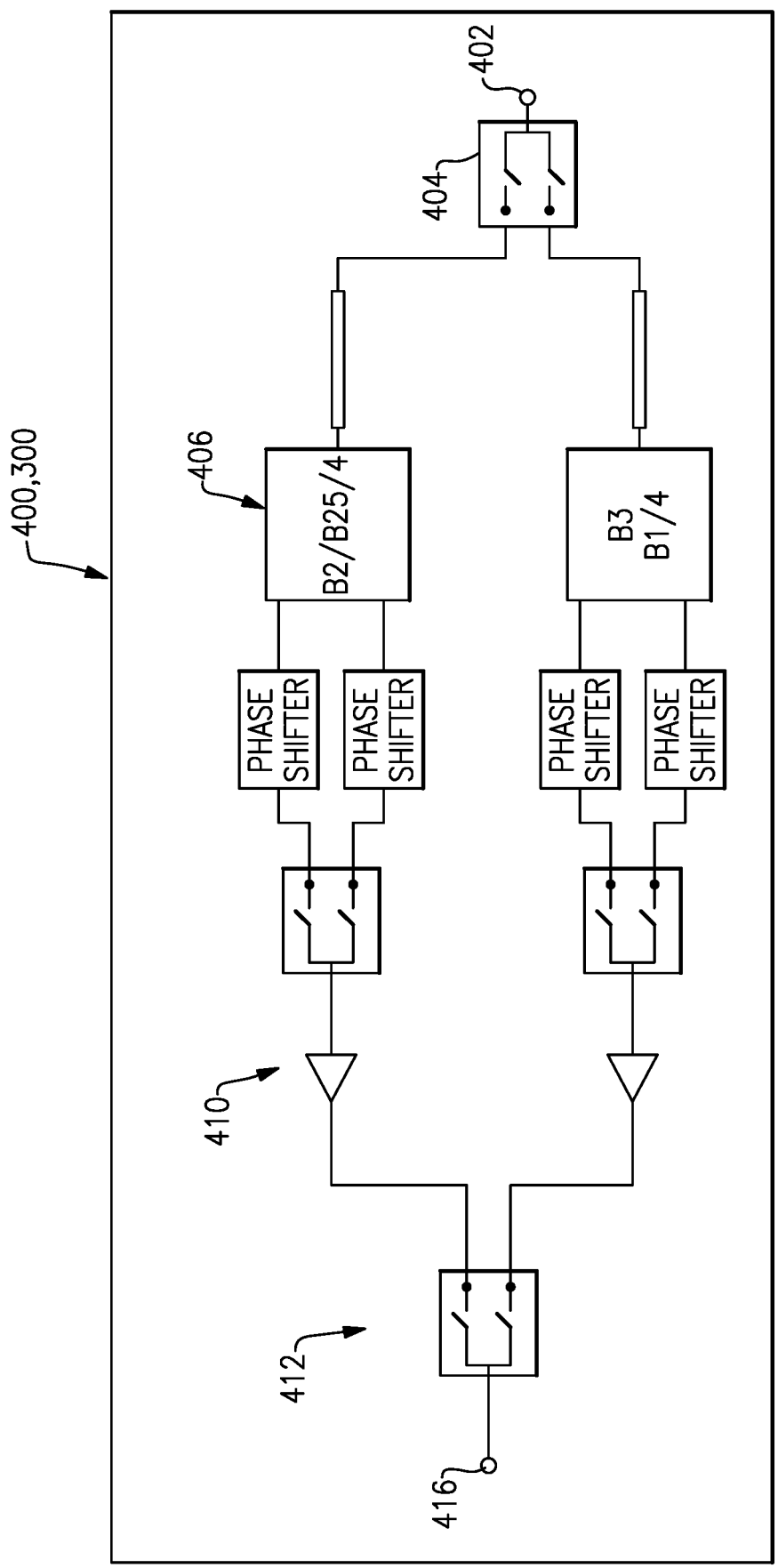
FIG. 19 shows an example of an RF architecture that includes one or more features as described herein.

FIG. 19 shows an example of an RF architecture 400 that includes one or more features as described herein. In some embodiments, such an architecture can be implemented on a module 300 such as the example described in reference to FIG. 18. It will be understood that the architecture 400 of FIG. 19 does not necessarily need to be confined to module.

The example architecture 400 of FIG. 19 can include a number of signal paths configured for receiving and/or transmitting RF signals. The architecture 400 can also include an antenna switching circuit 404 coupled to an antenna port 402. Such an antenna switching circuit can be configured to route RF signals in cellular frequency ranges to multiple paths associated with different cellular bands. In the example shown, the antenna switching circuit 404 includes a single-pole-2-throw (SP2T) switch, with the pole being coupled to the antenna port 402.

In the context of the example RX paths, the first path is configured for B2/625/4 bands, and the second path is configured for B3/61/4 bands. RF signals associated with such bands are shown to be processed by their respective filters 406.

Signals in the B2/625/4 bands (e.g., 1.930 to 1.995 GHz and 2.110 to 2.155 GHz) of the first path can be carrier aggregated as described herein and be amplified by an LNA of the group of LNAs 410. As described herein, carrier aggregation for the B2/625/4 bands can include a plurality of phase shifting circuits implemented between the B2/625/4 diplexer and the LNA. As also described herein, the paths between such phase shifting circuits and the LNA can include respective switches to allow operations in CA mode as well as non-CA mode.

Signals in the B3/B1/4 bands (e.g., 1.805 to 1.880 GHz and 2.110 to 2.170 GHz) of the second path can be carrier aggregated as described herein and be amplified by an LNA of the group of LNAs 410. Such an LNA can be configured to provide bandwidth coverage of, for example, 1.805 to 2.170 GHz. As described herein, such carrier aggregation can include a plurality of phase shifting circuits implemented between the B3/B1/4 diplexer and the LNA. As also described herein, the paths between such phase shifting circuits and the LNA can include respective switches to allow operations in CA mode as well as non-CA mode.

The amplified signals from the LNA can be routed to a band selection switch 412. The band selection switch 412 is shown to be coupled to a node 416 to allow further processing of an amplified RF signal from the selected LNA.

In some implementations, an architecture, device and/or circuit having one or more features described herein can be included in an RF device such as a wireless device. Such an architecture, device and/or circuit can be implemented directly in the wireless device, in one or more modular forms as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc. Although described in the context of wireless devices, it will be understood that one or more features of the present disclosure can also be implemented in other RF systems such as base stations.

Figure 20:
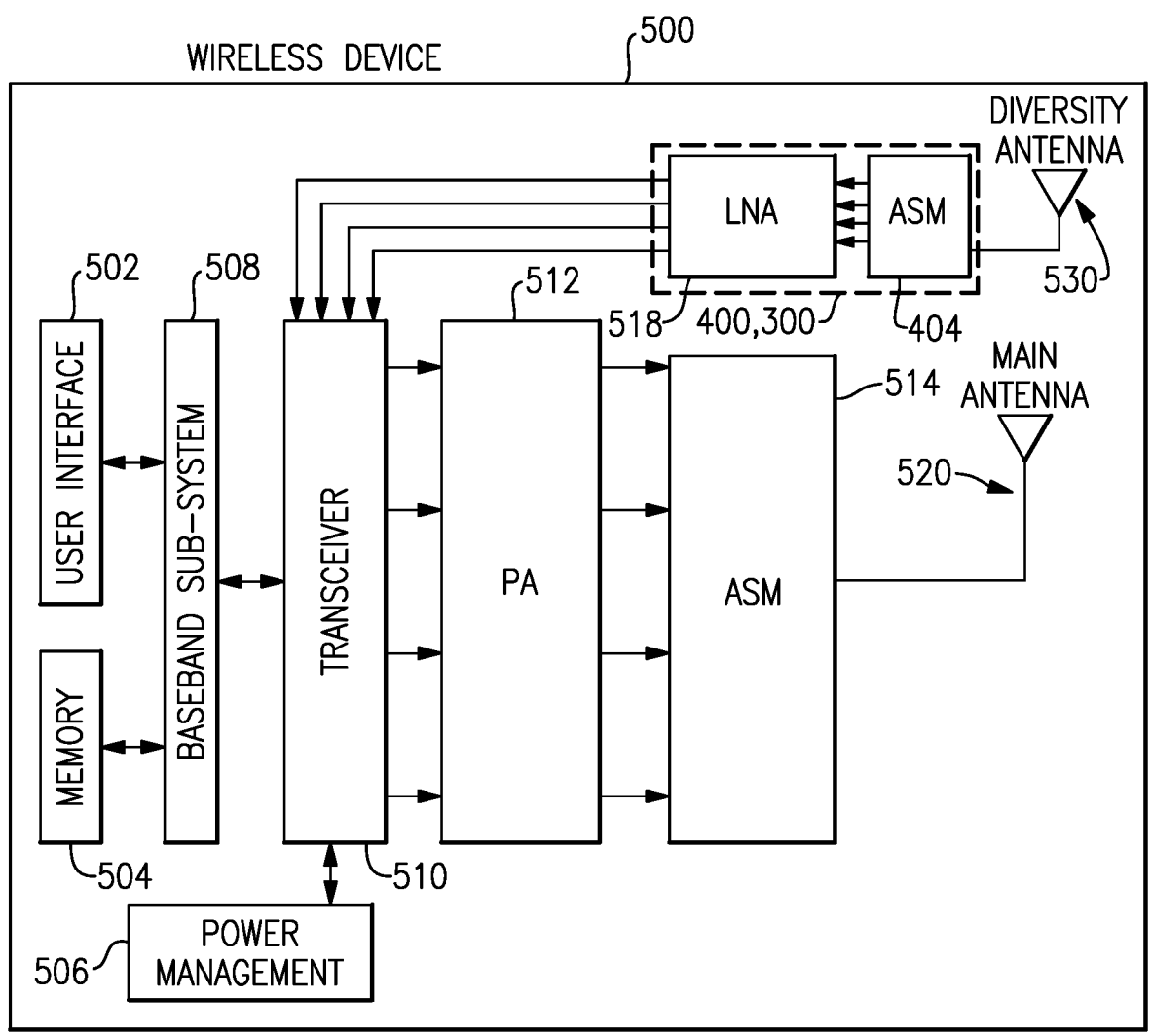
FIG. 20 depicts an example wireless device having one or more advantageous features described herein.

FIG. 20 schematically depicts an example wireless device 500 having one or more advantageous features described herein. In some embodiments, such advantageous features can be implemented in a front-end (FE) module 300 and/or in an architecture 400 as described herein. One or more of such features can also be implemented in a main antenna switch module (ASM) 514. In some embodiments, such an FEM/architecture can include more or less components than as indicated by the dashed box.

PAs in a PA module 512 can receive their respective RF signals from a transceiver 510 that can be configured and operated to generate RF signals to be amplified and transmitted, and to process received signals. The transceiver 510 is shown to interact with a baseband sub-system 508 that is configured to provide conversion between data and/or voice signals suitable for a user and RF signals suitable for the transceiver 510. The transceiver 510 is also shown to be connected to a power management component 506 that is configured to manage power for the operation of the wireless device 500. Such power management can also control operations of the baseband sub-system 508 and other components of the wireless device 500.

The baseband sub-system 508 is shown to be connected to a user interface 502 to facilitate various input and output of voice and/or data provided to and received from the user. The baseband sub-system 508 can also be connected to a memory 504 that is configured to store data and/or instructions to facilitate the operation of the wireless device, and/or to provide storage of information for the user.

In the example wireless device 500, the front-end module 300/architecture 400 can include one or more carrier aggregation-capable signal paths configured to provide one or more functionalities as described herein. Such signal paths can be in communication with an antenna switch module (ASM) 404 through their respective diplexer(s). In some embodiments, at least some of the signals received through a diversity antenna 530 can be routed from the ASM 404 to one or more low-noise amplifiers (LNAs) 518 in manners as described herein. Amplified signals from the LNAs 518 are shown to be routed to the transceiver 510.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Examples Related to Diversity Receive (DRx) Implementation:

Using one or more main antennas and one or more diversity antennas in a wireless device can improve quality of signal reception. For example, a diversity antenna can provide additional sampling of RF signals in the vicinity of the wireless device. Additionally, a wireless device's transceiver can be configured to process the signals received by the main and diversity antennas to obtain a receive signal of higher energy and/or improved fidelity, when compared to a configuration using only the main antenna.

To reduce the correlation between signals received by the main and diversity antennas and/or to enhance antenna isolation, the main and diversity antennas can be separated by a relatively large physical distance in the wireless device. For example, the diversity antenna can be positioned near the top of the wireless device and the main antenna can be positioned near the bottom of the wireless device, or vice-versa.

The wireless device can transmit or receive signals using the main antenna by routing corresponding signals from or to the transceiver through an antenna switch module. To meet or exceed design specifications, the transceiver, the antenna switch module, and/or the main antenna can be in relatively close physical proximity to one another in the wireless device. Configuring the wireless device in this manner can provide relatively small signal loss, low noise, and/or high isolation.

In the foregoing example, the main antenna being physically close to the antenna switch module can result in the diversity antenna being positioned relatively far from the antenna switch module. In such a configuration, a relatively long signal path between the diversity antenna and the antenna switch module can result in significant loss and/or addition of loss associated with the signal received through the diversity antenna. Accordingly, processing of the signal received through the diversity antenna, including implementation of one or more features as described herein, in the close proximity to the diversity antenna can be advantageous.

Figure 21:
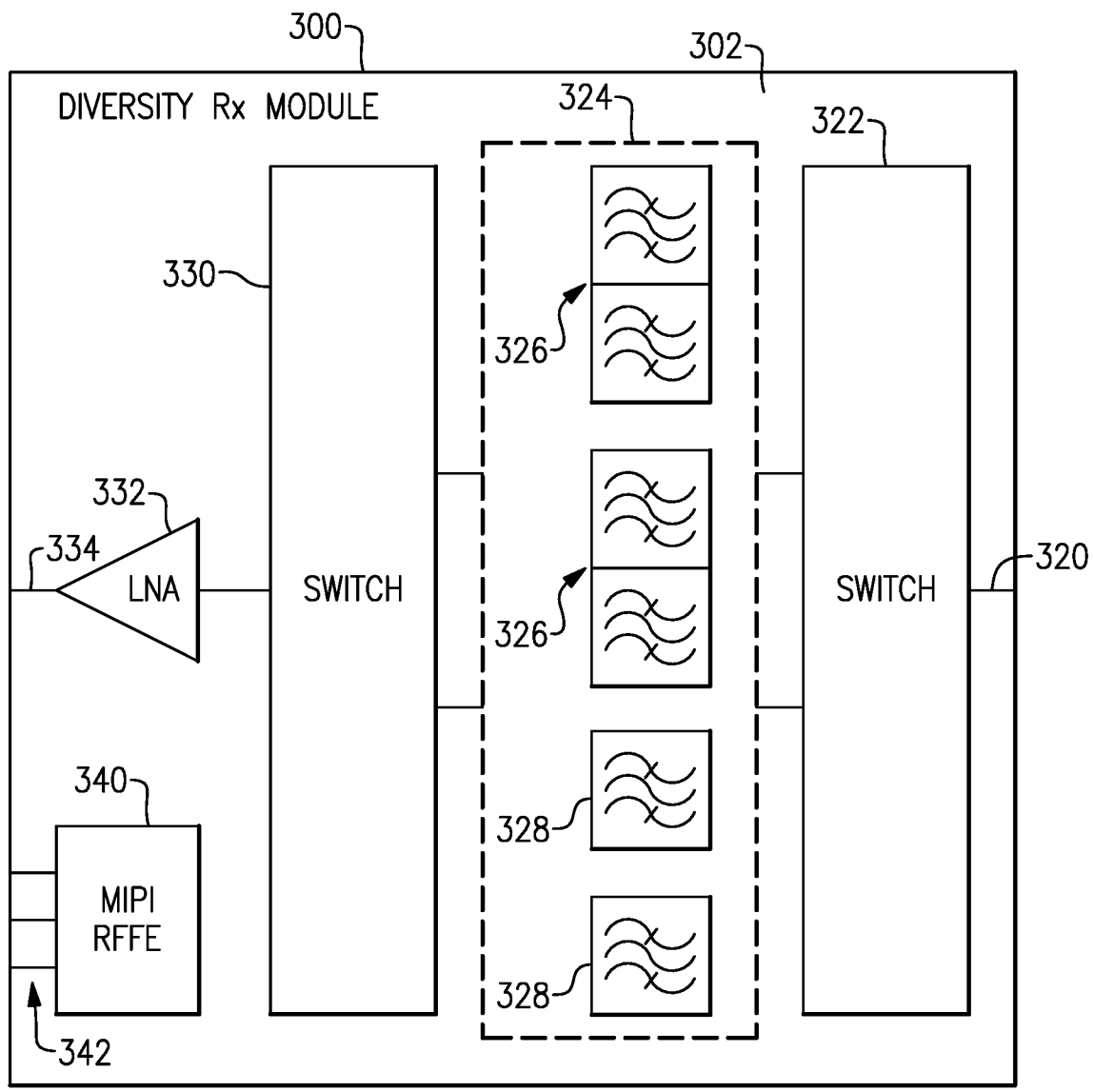
FIG. 21 shows that one or more features of the present disclosure can be implemented in a diversity receive module.

FIG. 21 shows that in some embodiments, one or more features of the present disclosure can be implemented in a diversity receive (DRx) module 300. Such a module can include a packaging substrate 302 (e.g., a laminate substrate) configured to receive a plurality of components, as well to provide or facilitate electrical connections associated with such components.

In the example of FIG. 21, the DRx module 300 can be configured to receive an RF signal from a diversity antenna (not shown in FIG. 21) at an input 320 and route such an RF signal to a low-noise amplifier (LNA) 332. It will be understood that such routing of the RF signal can involve carrier-aggregation (CA) and/or non-CA configurations. It will also be understood that although one LNA (e.g., a broadband LNA) is shown, there may be more than one LNAs in the DRx module 300. Depending on the type of LNA and the mode of operation (e.g., CA or non-CA), an output 334 of the LNA 332 can include one or more frequency components associated with one or more frequency bands.

In some embodiments, some or all of the foregoing routing of the RF signal between the input 320 and the LNA 332 can be facilitated by an assembly of one or more switches 322 between the input 320 and an assembly of diplexer(s) and/or filter(s) (collectively indicated as 324), and an assembly of one or more switches 330 between the diplexer/filter assembly 324 and the LNA 332. In some embodiments, the switch assemblies 322, 330 can be implemented on, for example, one or more silicon-on-insulator (SOI) die. In some embodiments, some or all of the foregoing routing of the RF signal between the input 320 and the LNA 332 can be achieved without some or all of the switches associated with the switch-assemblies 322, 330.

In the example of FIG. 21, the diplexer/filter assembly 324 is depicted as including two example diplexers 326 and two individual filters 328. It will be understood that the DRx module 300 can have more or less numbers of diplexers, and more or less numbers of individual filters. Such diplexer(s)/ filter(s) can be implemented as, for example, surface-mount devices (SMDs), as part of an integrated circuit (IC), of some combination thereof. Such diplexers/filters can include or be based on, for example, SAW filters, and can be configured as high Q devices.

In some embodiments, the DRx module 300 can include a control component such as a MIPI RFFE interface 340 configured to provide and/or facilitate control functionalities associated with some or all of the switch assemblies 322, 330 and the LNA 332. Such a control interface can be configured to operate with one or more I/O signals 342.

Figure 22:
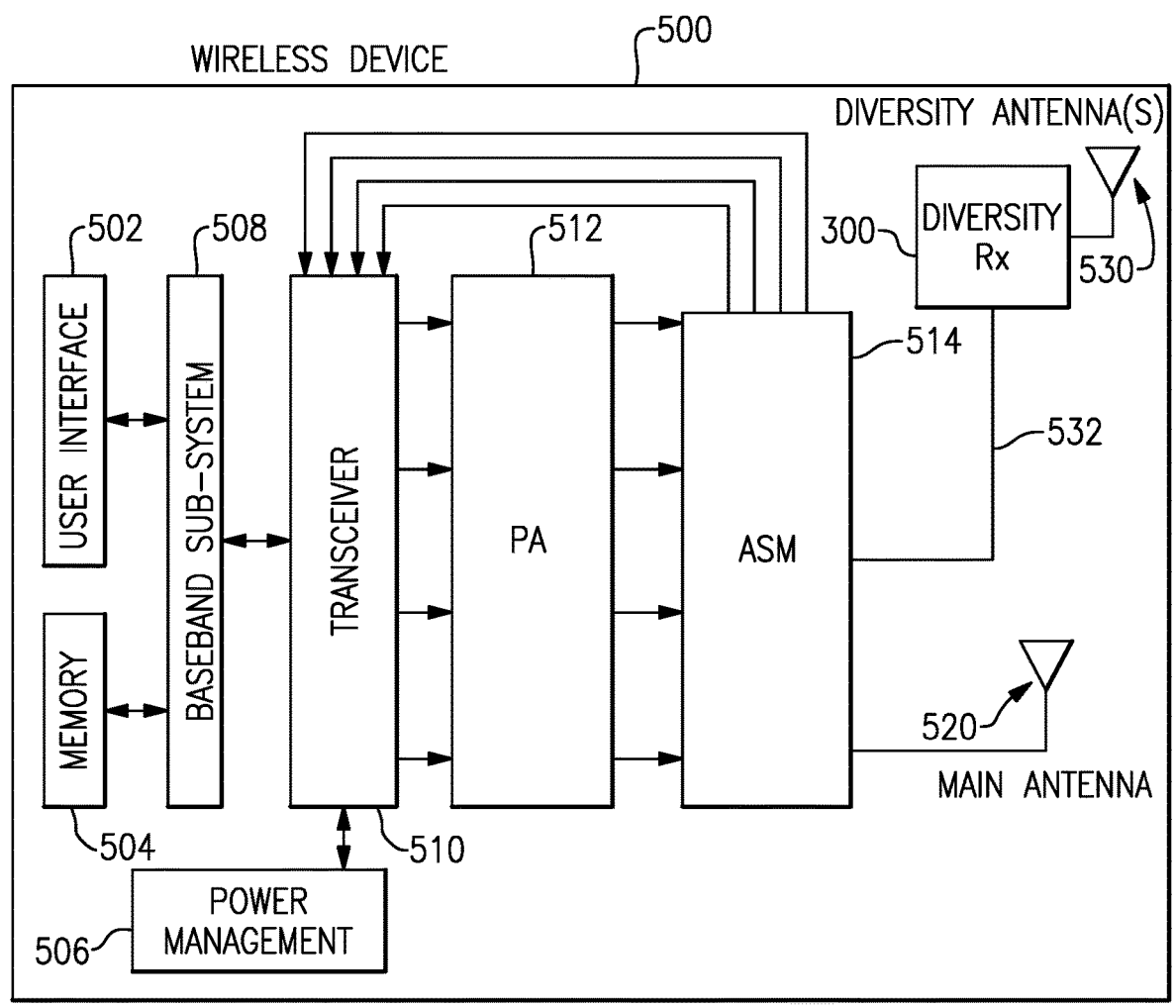
FIG. 22 shows an example wireless device having the diversity receive module of FIG. 21.

FIG. 22 shows that in some embodiments, a DRx module 300 having one or more features as described herein (e.g., DRx module 300 of FIG. 21) can be included in an RF device such as a wireless device 500. In such a wireless device, components such as user interface 502, memory 504, power management 506, baseband sub-system 508, transceiver 510, power amplifier (PA) 512, antenna switch module (ASM) 514, and antenna 520 can be generally similar to the examples of FIG. 20.

In some embodiments, the DRx module 300 can be implemented between one or more diversity antennas and the ASM 514. Such a configuration can allow an RF signal received through the diversity antenna 530 to be processed (in some embodiments, including amplification by an LNA) with little or no loss of and/or little or no addition of noise to the RF signal from the diversity antenna 530. Such processed signal from the DRx module 300 can then be routed to the ASM through one or more signal paths 532 which can be relatively lossy.

In the example of FIG. 22, the RF signal from the DRx module 300 can be routed through the ASM 514 to the transceiver 510 through one or more receive (Rx) paths. Some or all of such Rx paths can include their respective LNA(s). In some embodiments, the RF signal from the DRx module 300 may or may not be further amplified with such LNA(s).

One or more features of the present disclosure can be implemented with various cellular frequency bands as described herein. Examples of such bands are listed in Table 2. It will be understood that at least some of the bands can be divided into sub-bands. It will also be understood that one or more features of the present disclosure can be implemented with frequency ranges that do not have designations such as the examples of Table 2.

TABLE 2

| Band | Mode | Tx Frequency Range (MHz) | Rx Frequency Range (MHz) |
|------|------|--------------------------|--------------------------|
| B1   | FDD  | 1,920-1,980              | 2,110-2,170              |
| B2   | FDD  | 1,850-1,910              | 1,930-1,990              |
| B3   | FDD  | 1,710-1,785              | 1,805-1,880              |
| B4   | FDD  | 1,710-1,755              | 2,110-2,155              |
| B5   | FDD  | 824-849                  | 869-894                  |
| B6   | FDD  | 830-840                  | 875-885                  |
| B7   | FDD  | 2,500-2,570              | 2,620-2,690              |
| B8   | FDD  | 880-915                  | 925-960                  |
| B9   | FDD  | 1,749.9-1,784.9          | 1,844.9-1,879.9          |
| B10  | FDD  | 1,710-1,770              | 2,110-2,170              |
| B11  | FDD  | 1,427.9-1,447.9          | 1,475.9-1,495.9          |
| B12  | FDD  | 699-716                  | 729-746                  |
| B13  | FDD  | 777-787                  | 746-756                  |
| B14  | FDD  | 788-798                  | 758-768                  |
| B15  | FDD  | 1,900-1,920              | 2,600-2,620              |
| B16  | FDD  | 2,010-2,025              | 2,585-2,600              |
| B17  | FDD  | 704-716                  | 734-746                  |
| B18  | FDD  | 815-830                  | 860-875                  |
| B19  | FDD  | 830-845                  | 875-890                  |
| B20  | FDD  | 832-862                  | 791-821                  |
| B21  | FDD  | 1,447.9-1,462.9          | 1,495.9-1,510.9          |
| B22  | FDD  | 3,410-3,490              | 3,510-3,590              |
| B23  | FDD  | 2,000-2,020              | 2,180-2,200              |
| B24  | FDD  | 1,626.5-1,660.5          | 1,525-1,559              |
| B25  | FDD  | 1,850-1,915              | 1,930-1,995              |
| B26  | FDD  | 814-849                  | 859-894                  |
| B27  | FDD  | 807-824                  | 852-869                  |
| B28  | FDD  | 703-748                  | 758-803                  |
| B29  | FDD  | N/A                      | 716-728                  |
| B30  | FDD  | 2,305-2,315              | 2,350-2,360              |
| B31  | FDD  | 452.5-457.5              | 462.5-467.5              |
| B33  | TDD  | 1,900-1,920              | 1,900-1,920              |
| B34  | TDD  | 2,010-2,025              | 2,010-2,025              |
| B35  | TDD  | 1,850-1,910              | 1,850-1,910              |
| B36  | TDD  | 1,930-1,990              | 1,930-1,990              |
| B37  | TDD  | 1,910-1,930              | 1,910-1,930              |
| B38  | TDD  | 2,570-2,620              | 2,570-2,620              |
| B39  | TDD  | 1,880-1,920              | 1,880-1,920              |
| B40  | TDD  | 2,300-2,400              | 2,300-2,400              |
| B41  | TDD  | 2,496-2,690              | 2,496-2,690              |
| B42  | TDD  | 3,400-3,600              | 3,400-3,600              |
| B43  | TDD  | 3,600-3,800              | 3,600-3,800              |
| B44  | TDD  | 703-803                  | 703-803                  |

For the purpose of description, it will be understood that "multiplexer," "multiplexing" and the like can include "diplexer," "diplexing" and the like.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A carrier aggregation circuit for a first frequency band and a second frequency band, comprising
    a first node and a second node;
    a first path implemented between the first and second nodes, and including a first filter configured to provide a matched impedance in the first frequency band and a mismatched impedance in the second frequency band, the first path further including a first phase shifting circuit configured to adjust the mismatched impedance in the second frequency band to an approximately open-circuit impedance in the second frequency band;
    a second path implemented between the first and second nodes, and including a second filter configured to provide a matched impedance in the second frequency band and a mismatched impedance in the first frequency band, the second path further including a second phase shifting circuit configured to adjust the mismatched impedance in the first frequency band to an approximately open-circuit impedance in the first frequency band; and a switch assembly implemented to allow operation of either or both of the first and second paths.

2. The carrier aggregation circuit of claim 1 wherein the first node is configured to be coupled to a receive antenna, and the second node is configured to be coupled to an input of a low-noise amplifier.

3. The carrier aggregation circuit of claim 1 wherein the first phase shifting circuit is further configured to substantially maintain the matched impedance in the first frequency band, and the second phase shifting circuit is further configured to substantially maintain the matched impedance in the second frequency band.

4. The carrier aggregation circuit of claim 1 wherein the first phase shifting circuit is between the first filter and the second node, and the second phase shifting circuit is between the second filter and the second node.

5. The carrier aggregation circuit of claim 1 wherein the switch assembly includes a first switch implemented along the first path and a second switch implemented along the second path.

6. The carrier aggregation circuit of claim 5 wherein the first switch is implemented between the first phase shifting circuit and the second node, and the second switch is implemented between the second phase shifting circuit and the second node.

7. The carrier aggregation circuit of claim 5 wherein each of the first and second switches is configured to be in a closed state when in a carrier aggregation mode.

8. The carrier aggregation circuit of claim 5 wherein one of the first and second switches is configured to be in a closed state, and the other switch is configured to be in an open state, when in a non-carrier aggregation mode.

9. The carrier aggregation circuit of claim 1 wherein the first filter and the second filter are parts of a diplexer that includes an input port coupled to the first node.

10. The carrier aggregation circuit of claim 1 wherein each of the first and second phase shifting circuits includes two series capacitances and an inductive path that couples a node between the two capacitances and a ground.

11. The carrier aggregation circuit of claim 1 wherein each of the first and second phase shifting circuits includes two series inductances and a capacitive path that couples a node between the two inductances and a ground.

12. A method for carrier aggregation involving a first frequency band and a second frequency band, the method comprising receiving a signal at a first node;

processing a first portion of the signal to a second node through a first path, the processing including filtering the first portion to provide a matched impedance in the first frequency band and a mismatched impedance in the second frequency band, the processing further including phase shifting to adjust the mismatched impedance in the second frequency band to an approximately open-circuit impedance in the second frequency band;

processing a second portion of the signal to the second node through a second path, the processing including filtering the second portion to provide a matched impedance in the second frequency band and a mismatched impedance in the first frequency band, the processing further including phase shifting to adjust the mismatched impedance in the first frequency band to an approximately open-circuit impedance in the first frequency band; and operating a switch assembly to allow either or both of the processing of the first portion and the second portion.

13. The method of claim 12 wherein the phase shifting of the processing of the first portion substantially maintains the matched impedance in the first frequency band, and the phase shifting of the processing of the second portion substantially maintains the matched impedance in the second frequency band.

14. The method of claim 12 wherein the phase shifting of the processing of the first portion occurs after the filtering of the first portion, and the phase shifting of the processing of the second portion occurs after the filtering of the second portion.

15. The method of claim 12 wherein the operating of the switch assembly includes operating a first switch implemented along the first path and operating a second switch implemented along the second path, such that each of the first and second switches is in a closed state when in a carrier aggregation mode, and one of the first and second switches is in a closed state and the other switch is in an open state when in a non-carrier aggregation mode.

16. A radio-frequency module comprising a packaging substrate configured to receive a plurality of components; and a carrier aggregation circuit for a first frequency band and a second frequency band, implemented on the packaging substrate, the carrier aggregation circuit including a first node and a second node, and a first path implemented between the first and second nodes, and including a first filter configured to provide a matched impedance in the first frequency band and a mismatched impedance in the second frequency band, the first path further including a first phase shifting circuit configured to adjust the mismatched impedance in the second frequency band to an approximately open-circuit impedance in the second frequency band, the carrier aggregation circuit further including a second path implemented between the first and second nodes, and including a second filter configured to provide a matched impedance in the second frequency band and a mismatched impedance in the first frequency band, the second path further including a second phase shifting circuit configured to adjust the mismatched impedance in the first frequency band to an approximately open-circuit impedance in the first frequency band, the carrier aggregation circuit further including a switch assembly implemented to allow operation of either or both of the first and second paths.

17. The radio-frequency module of claim 16 further comprising a low-noise amplifier implemented on the packaging substrate and having an input coupled to the second node to receive and amplify a combined signal from the carrier aggregation circuit.

18. The radio-frequency module of claim 17 wherein the first node is configured to be coupled to a receive antenna.

19. The radio-frequency module of claim 18 wherein receive antenna is a diversity receive antenna, and the radio-frequency module is a diversity receive module positioned in close proximity to the diversity receive antenna.

20. The radio-frequency module of claim 16 further comprising a control component configured to allow operation of the switch assembly.

* * * * *